US008638611B2

(12) United States Patent
Sim et al.

(10) Patent No.: US 8,638,611 B2
(45) Date of Patent: Jan. 28, 2014

(54) VERTICAL NONVOLATILE MEMORY DEVICES AND METHODS OF OPERATING SAME

(75) Inventors: Jaesung Sim, Hwaseong-si (KR); Jungdal Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 39 days.

(21) Appl. No.: 13/342,361

(22) Filed: Jan. 3, 2012

(65) Prior Publication Data

US 2012/0170375 A1 Jul. 5, 2012

(30) Foreign Application Priority Data

Jan. 3, 2011 (KR) .................. 10-2011-0000277

(51) Int. Cl.
*G11C 16/04* (2006.01)
(52) U.S. Cl.
USPC ............. 365/185.19; 365/185.29; 365/185.27
(58) Field of Classification Search
USPC .............. 365/185.19, 185.27, 185.17–185.18
See application file for complete search history.

(56) References Cited

U.S. PATENT DOCUMENTS

| 4,665,505 | A | * | 5/1987 | Miyakawa et al. ........... 365/177 |
| 5,946,231 | A | | 8/1999 | Endoh et al. |
| 7,916,543 | B2 | * | 3/2011 | Goda et al. ............... 365/185.17 |
| 8,130,551 | B2 | * | 3/2012 | Oowada et al. .......... 365/185.19 |
| 8,163,617 | B2 | * | 4/2012 | Ahn .............................. 438/259 |
| 2004/0125629 | A1 | | 7/2004 | Scheuerlein et al. |

FOREIGN PATENT DOCUMENTS

| JP | 2007-058972 | 3/2007 |
| KR | 10-0909968 | 7/2009 |

\* cited by examiner

*Primary Examiner* — David Lam
(74) *Attorney, Agent, or Firm* — Myers Bigel Sibley & Sajovec, P.A.

(57) ABSTRACT

Integrated circuit memory devices include a plurality of vertically-stacked strings of nonvolatile memory cells having respective vertically-arranged channel regions therein electrically coupled to an underlying substrate. A control circuit is provided, which is configured to drive the vertical channel regions with an erase voltage that is ramped from a first voltage level to a higher second voltage level during an erase time interval. This ramping of the erase voltage promotes time efficient erasure of vertically stacked nonvolatile memory cells with reduced susceptibility to inadvertent programming of ground and string selection transistors (GST, SST).

20 Claims, 18 Drawing Sheets

Fig. 8

(PRIOR ART)

| BL | Float |
|---|---|
| SSL | Float |
| WL | Vwe (Low Votage) |
| GSL | Float |
| Substrate | Vers (High Votage) |

| BL | Float |
| --- | --- |
| SSL | 0V → Float |
| WL | Vwe (Low Voltage) |
| GSL | 0V → Float |
| Substrate | Vers (High Voltage) |

# VERTICAL NONVOLATILE MEMORY DEVICES AND METHODS OF OPERATING SAME

REFERENCE TO PRIORITY APPLICATION

This application claims the benefit, under 35 U.S.C §119, of Korean Patent Application No. 10-2011-0000277, filed Jan. 3, 2011, the disclosure of which is hereby incorporated herein by reference.

FIELD

The present invention relates to integrated circuit memory devices and methods of operating same and, more particularly, to nonvolatile memory devices and methods of operating same.

BACKGROUND

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices. The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type. To achieve higher levels of memory cell integration relative to planar memory devices, semiconductor memory devices with a three-dimensional array structure have been developed.

SUMMARY

Integrated circuit memory devices according to embodiments of the invention include a plurality of vertically-stacked strings of nonvolatile memory cells having respective vertically-arranged channel regions therein electrically coupled to an underlying substrate. A control circuit is also provided. The control circuit is configured to drive the vertical channel regions with an erase voltage that is ramped from a first voltage level to a higher second voltage level during an erase time interval. This ramping of the erase voltage promotes time efficient erasure of vertically stacked nonvolatile memory cells with reduced susceptibility to inadvertent programming of ground and string selection transistors (GST, SST). The driving of the vertical channel regions is performed concurrently with electrically floating ground and string selection lines (GSL, SSL) within the plurality of vertically-stacked strings of nonvolatile memory cells during at least a second portion of the erase time interval. The driving of the vertical channel regions may be performed by driving the underlying substrate with the erase voltage, which is transferred to the vertical channel regions by the electrical coupling between the substrate and the channel regions.

According to some embodiments of the invention, the control circuit includes an erase voltage generator, which is configured to generate the erase voltage as a monotonically increasing voltage during the erase time interval. In particular, the erase voltage generator may be configured to generate the erase voltage as a monotonically increasing voltage that is repeatedly stepped-up during multiple time intervals within the erase time interval. The erase voltage generator may include a totem-pole arrangement of transistors, which are configured as diodes. According to additional embodiments of the invention, the erase voltage generator includes a charge pump and a ramping circuit, which is configured to generate the erase voltage by sequentially tapping intermediate nodes of the totem-pole arrangement of transistors having different voltage levels. The ramping circuit may also include a timing control circuit, which is configured to generate a sequence of ramping enable signals during the erase time interval. These ramping enable signals may include respective pulses having leading edges (e.g., low-to-high signal transitions) that are spaced-apart relative to each other at respective time points within the erase time interval.

According to still further embodiments of the invention, the control circuit may be configured to drive a plurality of word lines within the plurality of vertically-stacked strings of nonvolatile memory cells with a voltage having a magnitude less than the first voltage level, during the erase time interval. In particular, the control circuit may be configured to drive the ground and string selection lines and the plurality of word lines with a ground reference voltage during a first portion of the erase time interval, which precedes the second portion of the erase time interval.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 8 is a diagram illustrating a voltage condition of a memory block at an erase operation according to the prior art.

DETAILED DESCRIPTION

Figure 1:
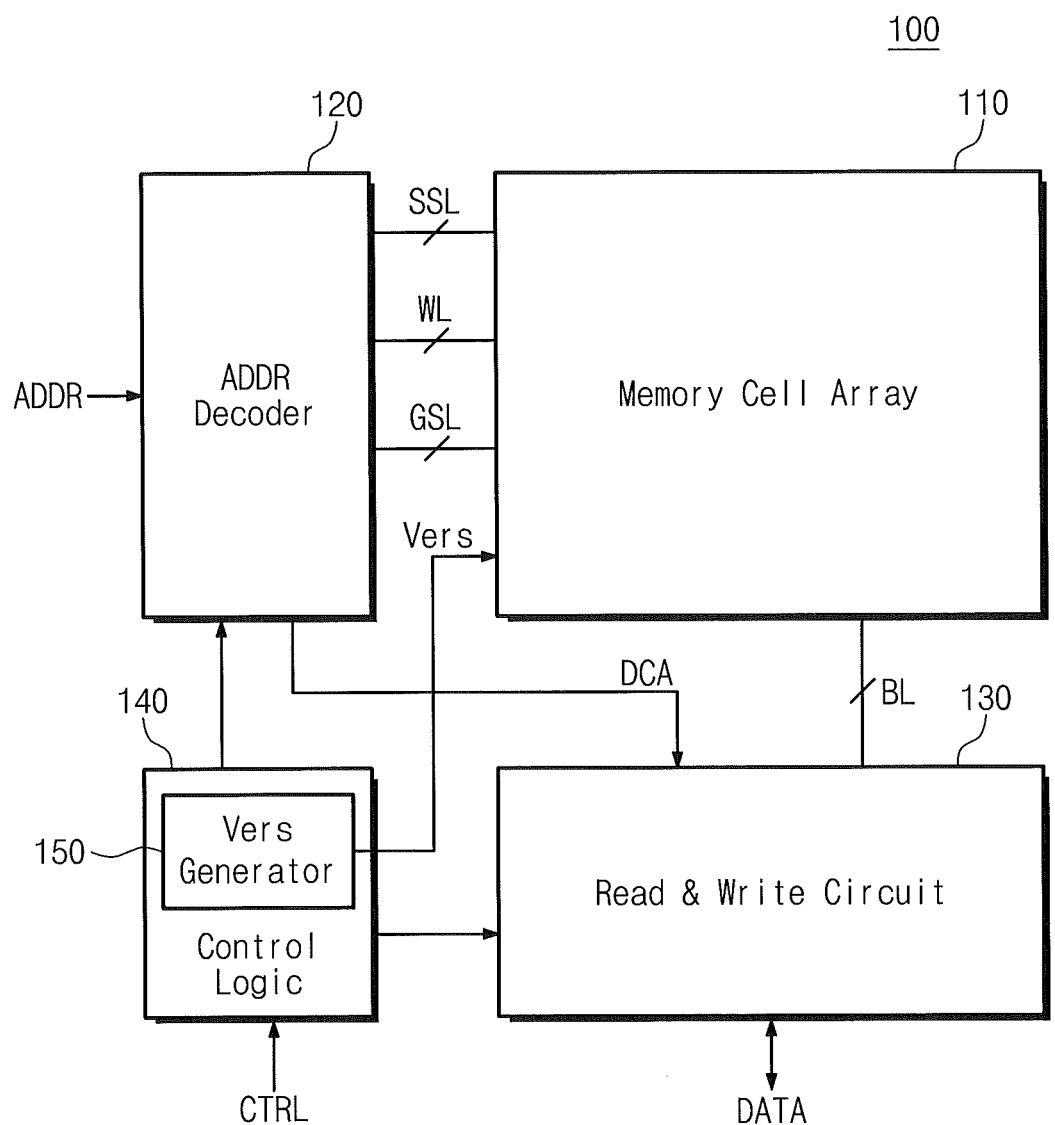
FIG. 1 is a block diagram illustrating a nonvolatile memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory device according to an exemplary embodiment of the inventive concept. Referring to FIG. 1, a nonvolatile memory device 100 may include a memory cell array 110, an address decoder 120, a read/write circuit 130, and control logic 140. The memory cell array 110 may include a plurality of memory cell groups. For example, the memory cell array 110 may include a plurality of cell strings which are arranged on a substrate along row and column directions. Each cell string may include a plurality of memory cells stacked along a direction perpendicular to the substrate. That is, the memory cells may be provided on the substrate along rows and columns and may be stacked in a direction perpendicular to the substrate to form a three-dimensional structure. In an exemplary embodiment, each memory cell of the memory cell array 110 may store one or more bits of data.

The address decoder 120 may be coupled with the memory cell array 110 via word lines WL, string selection lines SSL, and ground selection lines GSL. The address decoder 120 may be configured to operate responsive to the control of the control logic 140. The address decoder 120 may receive an address ADDR from an external device. The address decoder 120 may be configured to decode a row address of the input address ADDR. The address decoder 120 may be configured to select a word line corresponding to a decoded row address of the word lines WL. The address decoder 120 may be configured to select a string selection line SSL and a ground selection line GSL corresponding to the decoded row address of the string selection lines SSL and the ground selection lines GSL. The address decoder 120 may also be configured to decode a column address of the input address ADDR. The address decoder 120 may provide the decoded column address DCA to the read/write circuit 130. In an exemplary embodiment, the address decoder 120 may include a row decoder configured to decode a row address, a column decoder configured to decode a column address, and an address buffer storing the input address ADDR.

The read/write circuit 130 may be coupled with the memory cell array 110 via bit lines BL. The read/write circuit 130 may be configured to exchange data with an external device. The read/write circuit 130 may operate responsive to the control of the control logic 140. The read/write circuit 130 may select bit lines BL in response to the decoded column address DCA provided from the address decoder 120.

In an exemplary embodiment, the read/write circuit 130 may receive data from an external device to write it in the memory cell array 110. The read/write circuit 130 may read data from the memory cell array 110 to output it to the external device. The read/write circuit 130 may read data from the first storage area of the memory cell array 110 to write it into the second storage area thereof. That is, the read/write circuit 130 may perform a copy-back operation. In an exemplary embodiment, the read/write circuit 130 may include constituent elements such as a page buffer (or, a page register), a column selecting circuit, a data buffer, and the like. In another exemplary embodiment, the read/write circuit 130 may include constituent elements such as a sense amplifier, a write driver, a column selecting circuit, a data buffer, and the like.

The control logic 150 may be coupled with the address decoder 120 and the read/write circuit 130. The control logic 150 may be configured to control an overall operation of the nonvolatile memory device 100. The control logic 150 may include an erase voltage generator 150. At an erase operation, the erase voltage generator 150 may be configured to generate an erase voltage Vers. The erase voltage Vers may be transferred to the memory cell array 110. In an exemplary embodiment, the erase voltage Vers may be supplied to a substrate of the memory cell array 110.

Figure 2:
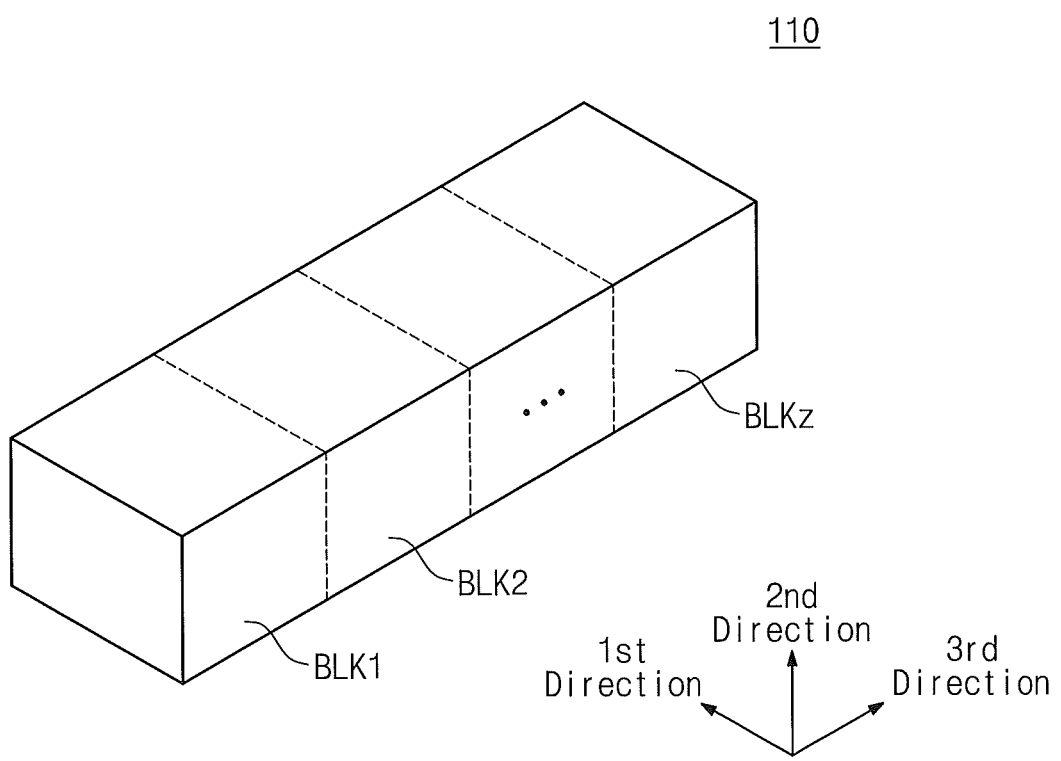
FIG. 2 is a diagram illustrating a memory cell array in FIG. 1 according to an exemplary embodiment of the inventive concept.

FIG. 2 is a diagram illustrating a memory cell array in FIG. 1 according to an exemplary embodiment of the inventive concept. Referring to FIGS. 1 and 2, a memory cell array 110 may include a plurality of memory blocks BLK1 to BLKz, each of which is connected with a plurality of bit lines BL, a plurality of string selection lines SSL, a plurality of word lines WL, a ground selection line GSL, and a common source line CSL. In an exemplary embodiment, the plurality of memory blocks BLK1 to BLKz may be selected by an address decoder 120 in FIG. 1. For example, the address decoder 120 may be configured to select a memory block corresponding to an input address ADDR among the plurality of memory blocks BLK1 to BLKz. Each of the memory blocks BLK1 to BLKz may be formed to have a three-dimensional structure (or, a vertical structure). For example, each of the memory blocks BLK1 to BLKz may include structures extending along the first to third directions. Each of the memory blocks BLK1 to BLKz may include a plurality of cell strings extending along the second direction. A plurality of cell strings may be spaced apart from one other along the first and third directions. Each cell string may be coupled with a bit line BL, a string selection line SSL, a plurality of word lines WL, a ground selection line GSL, and a common source line CSL.

Figure 3:
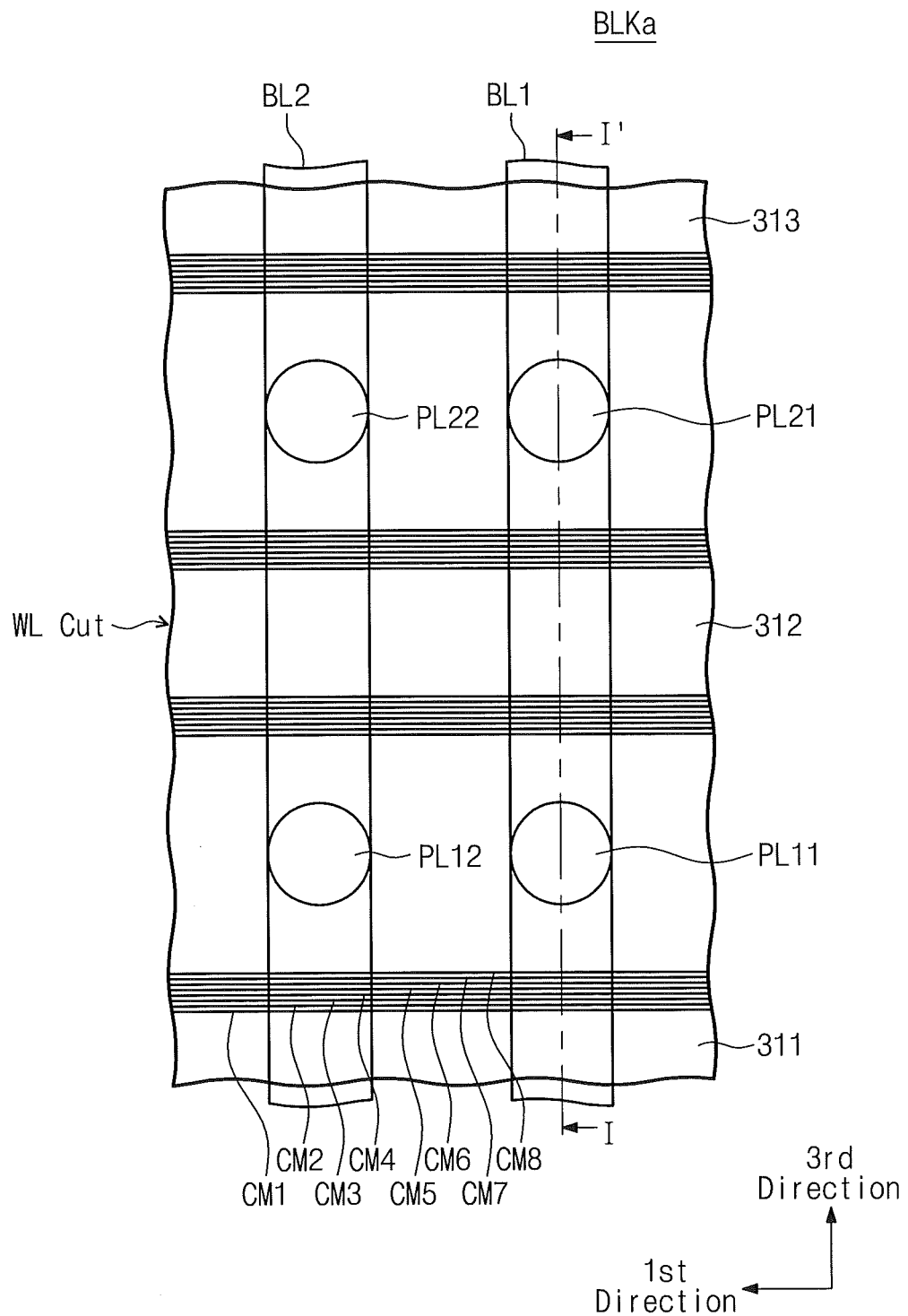
FIG. 3 is a plan view of one of memory blocks in FIG. 1 according to an exemplary embodiment of the inventive concept.
Figure 4:
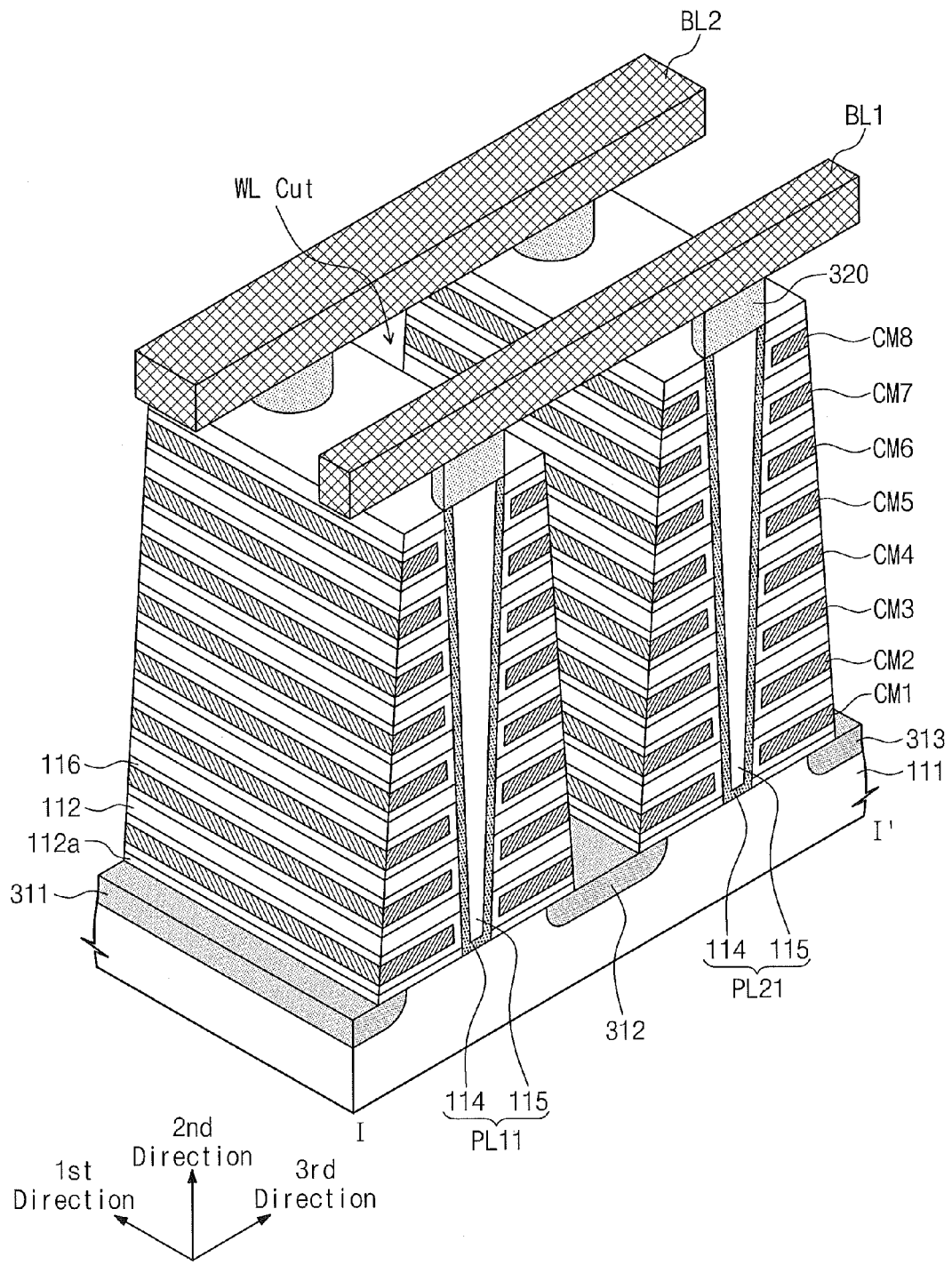
FIG. 4 is a perspective view taken along a line I-I' of a memory block in FIG. 3 according to an exemplary embodiment of the inventive concept.
Figure 5:
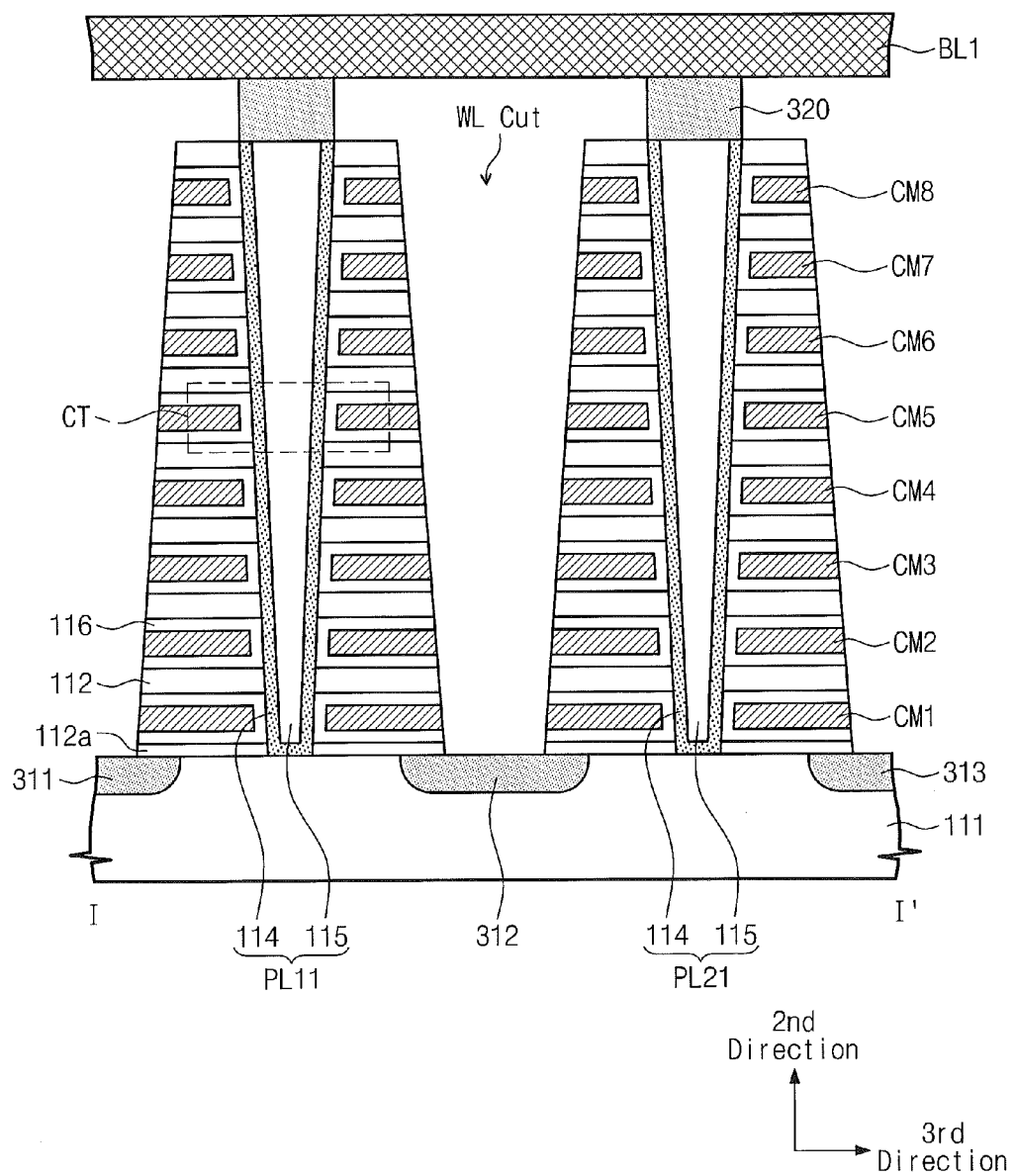
FIG. 5 is a cross-sectional view taken along a line I-I' of a memory block in FIG. 3 according to an exemplary embodiment of the inventive concept.

FIG. 3 is a plane diagram of one of memory blocks in FIG. 1 according to an exemplary embodiment of the inventive concept. In an exemplary embodiment, a plane view illustrating conductive layers of a memory block BLKa is shown in FIG. 3. FIG. 4 is a perspective view taken along a line I-I' of a memory block in FIG. 3 according to an exemplary embodiment of the inventive concept. FIG. 5 is a cross-sectional view taken along a line I-I' of a memory block in FIG. 3 according to an exemplary embodiment of the inventive concept.

Referring to FIGS. 3 to 5, the memory block BLKa may include three-dimensional structures extending along the first to third directions. A substrate 111 is provided. The substrate 111 may be a well having the first conductive type, for example. The substrate 111 may be a p-well in which the Group III element such as boron is injected, for example. The substrate 111 may be a pocket p-well which is provided within an n-well. Below, it is assumed that the substrate 111 is a p-well (or, a pocket p-well). However, the substrate 111 is not limited to p-type. A plurality of doping regions 311 to 313 extending along the first direction may be provided in the substrate 111. The doping regions 311 to 313 may be spaced apart along the third direction. The doping regions 311 to 313 illustrated in FIGS. 3 to 5 may be referred to as the first to third doping regions 311 to 313, respectively. The first to third doping regions 311 to 313 may have an n-type conductive material different from that of the substrate 111. Below, it is assumed that the first to third doping regions 311 to 313 are n-type. However, the first to third doping regions 311 to 313 are not limited to the n-type.

Between adjacent doping regions of the first to third doping regions 311 to 313, a plurality of insulation materials 112 and 112a may be provided sequentially along the second direction (i.e., a direction normal to the substrate 111). The insulation materials 112 and 112a may be formed to be spaced apart along the second direction. In an exemplary embodiment, the insulation materials 112 and 112a may be extended along the first direction. For example, the insulation materials 112 and 112a may include an insulation material such as silicon oxide. In an exemplary embodiment, a thickness of the insulation material 112a contacting with the substrate 111 may be thinner than that of the insulation materials 112.

Between adjacent doping regions of the first to third doping regions 311 to 313, a plurality of pillars PL11, PL12, PL21, and PL22 may be arranged sequentially along the first direction so as to penetrate the plurality of insulation materials 112 and 112a along the second direction. For example, the pillars PL11, PL12, PL21, and PL22 may contact with the substrate 111 through the insulation materials 112 and 112a. In an exemplary embodiment, the pillars PL11, PL12, PL21, and PL22 may be formed of a plurality of materials, respectively. For example, the pillars PL11, PL12, PL21, and PL22 may include channel films 114 and inner materials 115. In each of the pillars PL11, PL12, PL21, and PL22, an inner material and a channel film surrounding the inner material may be provided.

The channel films 114 may include a semiconductor material (e.g., silicon) having the first conductive type. For example, the channel films 114 may include a semiconductor material (e.g., silicon) having the same conductive type as the substrate 111. Below, it is assumed that the channel films 114 include p-type silicon. However, the channel films 114 may not be limited to include the p-type silicon. For example, the channel films 114 may include intrinsic semiconductor being a relative nonconductor. The inner materials 115 may include an insulation material. For example, the inner materials 115 may include an insulation material such as silicon oxide. Alternatively, the inner materials 115 may include air gap.

Information storage films 116 may be provided between adjacent doping regions of the first to third doping regions 311 and 313 along exposed surfaces of the insulation materials 112 and 112a and the pillars PL11, PL12, PL21, and PL22. In an exemplary embodiment, a thickness of the information storage film 116 may be less than half a distance between the insulation materials 112 and 112a. Between adjacent doping regions of the first to third doping regions 311 to 313, conductive materials CM1 to CM8 may be provided on exposed surfaces of the information storage films 116. For example, the conductive material CM1 to CM8 extending along the first direction may be provided between an information storage film 116 provided at a lower surface of an upper insulation material of the insulation materials 112 and 112a and the information storage film 116 provided at an upper surface of a lower insulation material of the insulation materials 112 and 112a. The conductive materials CM1 to CM8 and the insulation materials 112 and 112a may be separated on the doping regions 311 to 313 by word line cuts. In an exemplary embodiment, the conductive materials CM1 to CM8 may include a metallic conductive material. The conductive materials CM1 to CM8 may alternatively include a nonmetallic conductive material such as polysilicon.

In an exemplary embodiment, information storage films provided on an upper surface of an insulation material placed at the uppermost layer among the insulation materials 112 and 112a can be removed. Exemplarily, information storage films provided at sides opposite to the pillars PL among sides of the insulation materials 112 and 112a can be removed.

A plurality of drains 320 may be provided on the plurality of pillars PL11, PL12, PL21, and PL22, respectively. The drains 320 may include a semiconductor material (e.g., silicon) having the second conductivity type, for example. The drains 320 may include an n-type semiconductor material (e.g., silicon). Below, it is assumed that the drains 320 include n-type silicon. However, the prevent invention is not limited thereto. The drains 320 can be extended to the upside of the channel films 114 of the pillars PL11, PL12, PL21, and PL22.

Bit lines BL1 and BL2 extending in the third direction may be provided on the drains 320 so as to be spaced apart from one another along the first direction. The bit lines BL1 and BL2 may be coupled with the drains 320. In this embodiment, the drains 320 and the bit lines BL may be connected via contact plugs (not shown). The bit lines BL may include a metallic conductive material. Alternatively, the bit lines BL may include a nonmetallic conductive material such as polysilicon (e.g., highly doped polysilicon).

Below, rows and columns of pillars PL11, PL12, PL21, and PL22 in the memory block BLKa may be defined. In an exemplary embodiment, rows of the pillars PL11, PL12, PL21, and PL22 may be defined according to whether the conductive materials CM1 to CM8 are separated or not. The conductive materials CM1 to CM8 may be separated on the basis of the doping region 312. Pillars PL11 and PL12 connected via the conductive materials CM1 to CM8 with the information storage films 116 provided between the first and second doping regions 311 and 312 may constitute the first row of pillars. Pillars PL21 and PL22 connected via the conductive materials CM1 to CM8 with the information storage films 116 provided between the second and third doping regions 312 and 313 may constitute the second row of pillars. Columns of the pillars PL11, PL12, PL21, and PL22 may be defined along the bit lines BL1 and BL2. Pillars PL11 and PL21 connected with the first bit line BL1 via the drain 320 may constitute the first column of pillars. Pillars PL12 and PL22 connected with the second bit line BL2 via the drain 320 may constitute the second column of pillars.

Below, heights of the conductive materials CM1 to CM8 may be defined. The conductive materials CM1 to CM8 may have the first to eighth heights according to a distance from the substrate 111. The conductive materials CM1 closest to the substrate 111 may have the first height. The conductive materials CM8 closest to the bit lines BL1 and BL2 may have the eighth height.

Each of the pillars PL11, PL12, PL21, and PL22 may constitute one cell string with adjacent information storage films 116 and adjacent conductive materials CM1 to CM8. That is, the pillars PL11, PL12, PL21, and PL22 may constitute a plurality of cell strings with information storage films 116 and a plurality of conductive materials CM1 to CM8.

Figure 6:
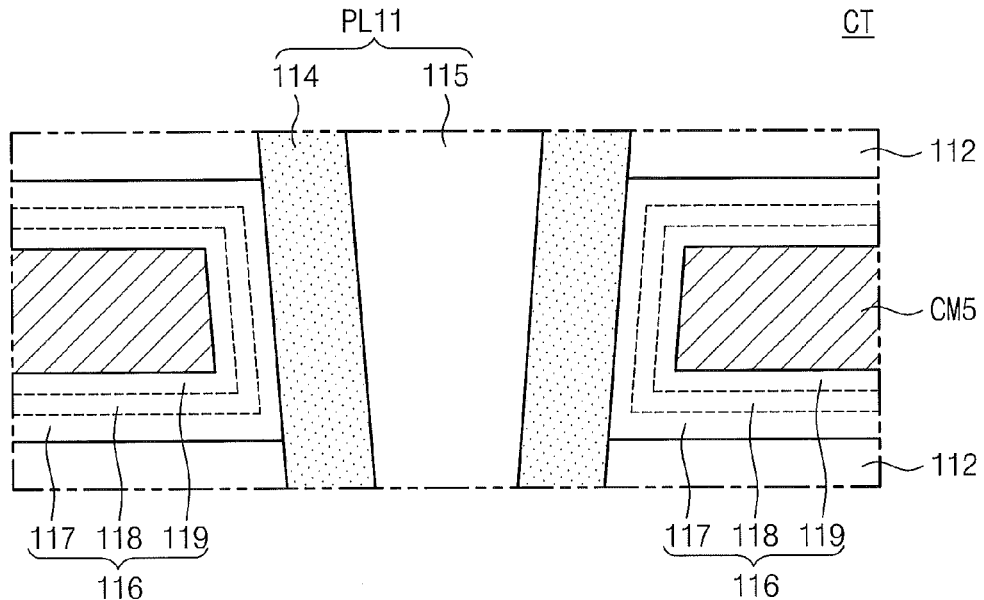
FIG. 6 is a diagram illustrating one of cell transistors in FIG. 5.

Each of cell strings may include a plurality of cell transistors CT stacked in a direction perpendicular to the substrate 111. The cell transistors CT will be more fully described with reference to FIG. 6. FIG. 6 is a diagram illustrating one of cell transistors in FIG. 5. In an exemplary embodiment, in FIG. 6, there may be illustrated a cell transistor with the fifth height among a plurality of cell transistors CT corresponding to a pillar PL11 of the first row and the first column.

Referring to FIGS. 3 to 6, cell transistors CT may be formed of the fifth conductive material CM5, a part of a pillar PL11 adjacent to the fifth conductive material CM5, and an information storage film provided between the conductive material CM5 and the pillar PL11. The information storage films 116 may extend to upper surfaces and lower surfaces of the conductive materials CM1 to CM8 from regions between the conductive materials CM1 to CM8 and the pillars PL11, PL12, PL21, and PL22. Each of the information storage films 116 may include the first to third sub insulation films 117, 118, and 119. In the cell transistors CT, the channel films 114 of the pillars PL11, PL12, PL21, and PL22 may include the same p-type silicon as the substrate 111. The channel films 114 may act as bodies of cell transistors CT. The channel films 114 may be formed in a direction perpendicular to the substrate 111. The channel films 114 of the pillars PL11, PL12, PL21, and PL22 may act as a vertical body. Vertical channels may be formed at the channel films 114 of the pillars PL11, PL12, PL21, and PL22.

The first sub insulation films 117 adjacent to the pillars PL11, PL12, PL21, and PL22 may act as tunneling insulation films of the cell transistors CT. For example, the first sub insulation films 117 adjacent to the pillars PL11, PL12, PL21, and PL22 may include a thermal oxide film, respectively. The first sub insulation films 117 may include a silicon oxide film, respectively. The second sub insulation films 118 may act as charge storage films of the cell transistors CT. For example, the second sub insulation films 118 may act as a charge trap film, respectively. For example, the second sub insulation films 118 may include a nitride film or a metal oxide film (e.g., an aluminum oxide film, a hafnium oxide film, etc.), respectively. The second sub insulation films 118 may include a silicon nitride film. The third sub insulation films 119 adjacent to the conductive materials CM1 to CM8 may act as blocking insulation films of the cell transistors CT. In this embodiment, the third sub insulation films 119 may be formed of a single layer or multiple layers. The third sub insulation films 119 may be a high dielectric film (e.g., an aluminum oxide film, a hafnium oxide film, etc.) having a dielectric constant larger than those of the first and second sub insulation films 117 and 118. The third sub insulation films 119 may include a silicon oxide film, respectively. In this embodiment, the first to third sub insulation films 117 to 119 may constitute ONO (oxide-nitride-oxide).

The plurality of conductive materials CM1 to CM8 may act as a gate (or, a control gate), respectively. That is, the plurality of conductive materials CM1 to CM8 acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute cell transistors CT stacked in a direction perpendicular to the substrate 111. Exemplarily, the cell transistors CT may be a charge trap type cell transistor.

The cell transistors CT can be used for different purposes according to height. For example, among the cell transistors CT, at least one cell transistor placed at an upper portion may be used as a string selection transistor. Among the cell transistors CT, at least one cell transistor placed at a lower portion may be used as a ground selection transistor. Remaining cell transistors may be used as a memory cell and a dummy memory cell.

The conductive materials CM1 to CM8 may extend along a row direction (the first direction) to be connected with a plurality of pillars PL11 and PL12 or PL21 and PL22. The conductive materials CM1 to CM8 may constitute conductive lines interconnecting cell transistors CT of the pillars PL11 and PL12 or PL21 and PL22 in the same row. In this embodiment, the conductive materials CM1 to CM8 may be used as a string selection line, a ground selection line, a word line, or a dummy word line according to the height.

Figure 7:
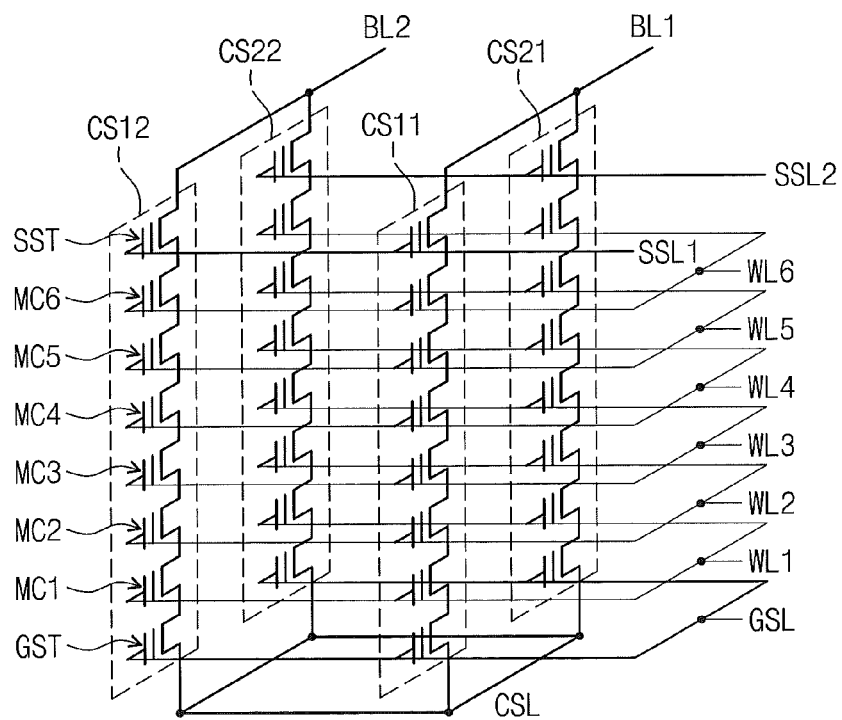
FIG. 7 is a circuit diagram illustrating an equivalent circuit of a memory block described in FIGS. 3 to 6.

FIG. 7 is a circuit diagram illustrating an equivalent circuit of a memory block described in FIGS. 3 to 6. Referring to FIGS. 3 to 7, cell strings CS11 and CS21 may be connected between the first bit line BL1 and a common source line CSL, and cell strings CS12 and CS22 may be connected between the second bit line BL2 and the common source line CSL. The cell strings CS11, CS21, CS12, and CS22 may correspond to pillars PL11, PL21, PL12, and PL22, respectively. The pillar PL11 of the first row and the first column may form the cell string CS11 of the first row and the first column with conductive materials CM1 to CM8 and information storage films 116. The pillar PL12 of the first row and the second column may form the cell string CS12 of the first row and the second column with the conductive materials CM1 to CM8 and the information storage films 116. The pillar PL21 of the second row and the first column may form the cell string CS21 of the second row and the first column with the conductive materials CM1 to CM8 and the information storage films 116. The pillar PL22 of the second row and the second column may form the cell string CS22 of the second row and the second column with the conductive materials CM1 to CM8 and the information storage films 116.

In the cell strings CS11, CS21, CS12, and CS22, cell transistors with the first height may act as ground selection transistors GST. Cell strings of the same row may share a ground selection line GSL. Cell strings of different rows may share the ground selection line GSL. In an exemplary embodiment, the first conductive materials CM1 may be interconnected to form the ground selection line GSL. In the cell strings CS11, CS21, CS12, and CS22, cell transistors with the second to sixth heights may act as the first to sixth memory cells MC1 to MC6. The first to sixth memory cells MC1 to MC6 may be connected with the first to sixth word lines WL1 to WL6, respectively. Memory cells having the same height and corresponding to the same row may share a word line. Memory cells having the same height and corresponding to different rows may share a word line. That is, memory cells MC having the same height may share a word line.

In an exemplary embodiment, the second conductive materials CM2 may be interconnected to form the first word line WL1. The third conductive materials CM3 may be interconnected to form the second word line WL2. The fourth conductive materials CM4 may be interconnected to form the third word line WL3. The fifth conductive materials CM5 may be interconnected to form the fourth word line WL4. The sixth conductive materials CM6 may be interconnected to form the fifth word line WL5. The seventh conductive materials CM7 may be interconnected to form the sixth word line WL6.

In the cell strings CS11, CS21, CS12, and CS22, cell transistors with the eighth height may act as string selection transistors SST. The string selection transistors SST may be connected with the first and second string selection lines SSL1 and SSL2. Cell strings of the same row may share a string selection line SSL. Cell strings of different rows may be connected with different string selection lines. In an exemplary embodiment, each of the first and second string selection lines SSL1 and SSL2 may correspond to the eight conductive materials CM8. That is, the pillars PL11, PL12, PL21, and PL22, that is, rows of cell strings CS11, CS12, CS21, and CS22 may be defined by the first and second string selection lines SSL1 and SSL2. Below, string selection transistors connected with the first string selection line SSL1 may be referred to as the first string selection transistors SST1, and string selection transistors connected with the second string selection line SSL2 may be referred to as the second string selection transistors SST2. The common source line CSL may be connected in common with the cell strings CS11, CS12, CS21, and CS22. For example, the first to third doping regions 311 to 313 may be interconnected to form the common source line CSL.

As illustrated in FIG. 7, memory cells having the same height may be connected in common with one word line. Accordingly, when a word line with a specific height is selected, all cell strings CS11, CS12, CS21, and CS22 connected with the selected word line may be selected. Cell strings of different rows may be connected with different string selection lines. Accordingly, in the cell strings CS11, CS12, CS21, and CS22 connected with the same word line, an unselected row of cell strings CS11 and CS12 or CS21 and CS22 may be electrically separated from the bit lines BL1 and BL2 by selecting and unselecting the first and second string selection lines SSL1 and SSL2. A selected row of cell strings CS21 and CS22 or CS11 and CS12 may be electrically connected with the bit lines BL1 and BL2. That is, rows of the cell strings CS11, CS12, CS21, and CS22 may be selected by selecting and unselecting the first and second string selection lines SSL1 and SSL2. Columns of cell strings in a selected row may be selected by selecting the bit lines BL1 and BL2.

In an exemplary embodiment, at least one of the word lines WL1 to WL6 may be used as a dummy word line. For example, a word line adjacent to the string selection lines SSL1 and SSL2, a word line adjacent to the ground selection line GSL, or at least one of word lines between the string selection lines SSL1 and SSL2 and the ground selection line GSL may be used as a dummy word line.

In an exemplary embodiment, at least two conductive materials of the conductive materials CM1 to CM8 may form string selection lines. For example, the seventh and eighth conductive materials CM7 and CM8 may be used as string selection lines. At this time, the seventh and eighth conductive materials CM7 and CM8 in the same row may be connected in common. In an exemplary embodiment, at least two conductive materials of the conductive materials CM1 to CM8 may form a ground selection line. For example, the first and second conductive materials CM1 and CM2 may be used as a ground selection line. At this time, the first and second conductive materials CM1 and CM2 in the same row may be connected in common. In an exemplary embodiment, the first conductive materials CM1 may form two ground selection lines being electrically separated.

Figure 9:
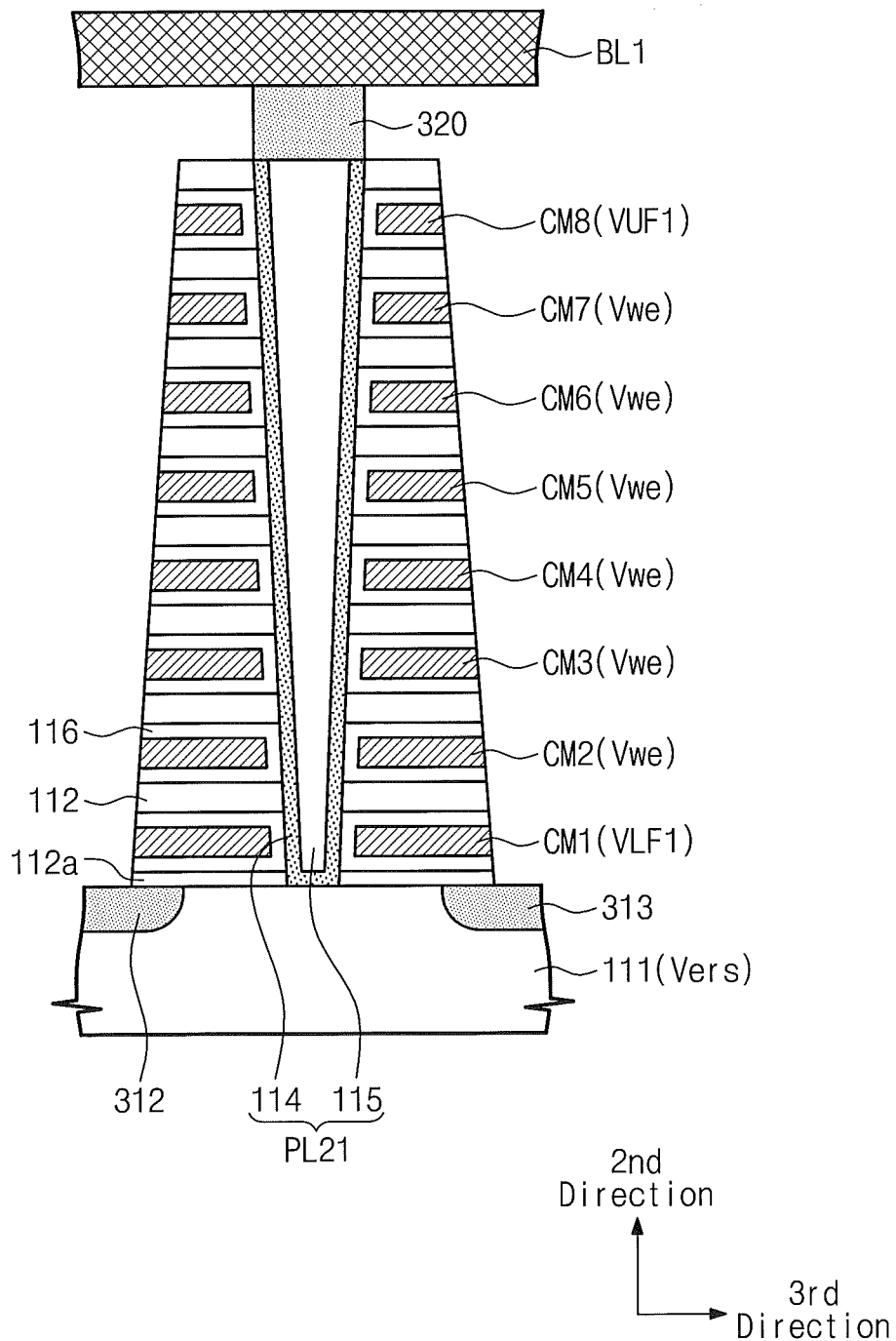
FIG. 9 is a diagram illustrating a cell string biased according to the voltage condition in FIG. 8.

FIG. 8 is a diagram illustrating a voltage condition of a memory block at an erase operation according to the prior art. FIG. 9 is a diagram illustrating a cell string biased according to a voltage condition in FIG. 8. In an exemplary embodiment, a cell string CS21 of the second row and the first row is exemplarily illustrated in FIG. 9. Referring to FIGS. 7 to 9, an erase voltage Vers may be supplied to a substrate 111. The erase voltage Vers may be a high voltage. The erase voltage Vers may be transferred to channel films 114 via the substrate 111.

A ground selection line GSL may be floated. As voltages of the substrate 111 and the channel films 114 are increased by the erase voltage Vers, a voltage of the ground selection line GSL may be also increased. In an embodiment, a voltage of the ground selection line GSL may be a lower floating voltage VGF1. A word line erase voltage Vwe may be supplied to word lines WL1 to WL6. The word line erase voltage Vwe may be a low voltage. The word line erase voltage Vwe may be a ground voltage VSS.

String selection lines SSL1 and SSL2 may be floated. As voltages of the substrate 111 and the channel films 114 are increased by the erase voltage Vers, voltages of the string selection lines SSL1 and SSL2 may be also increased. In an embodiment, voltages of the string selection lines SSL1 and SSL2 may be an upper floating voltage VUF1. Bit lines BL1 and BL2 may be floated. The erase voltage Vers may be supplied to the bit lines BL1 and BL2 via the substrate 111, the channel films 114, and drains 320.

Electrons may exist at the channel films 114 before the erase voltage Vers is supplied to the substrate 111. If the channel films 114 are p-type, electrons may exist as a minority carrier. If the channel films 114 are intrinsic semiconductor, the number of electrons may be more than that of channel films 114 being p-type.

If the erase voltage Vers is supplied to the substrate 111, electrons may move into the substrate 111 via the channel films 114. Before all electrons of the channel films 114 moves into the substrate 111, a voltage of the substrate 111 may increase over a specific level. Further, a voltage of the ground selection line GSL may increase over the specific level. At this time, a hot electron injection program condition may be satisfied. Electrons of the channel films 114 may be accelerated in a substrate direction due to an electric field generated from the substrate 111. The accelerated electrons may be injected to information storage films 116 of ground selection transistors GST due to the electric field generated from the ground selection line GSL. That is, the ground selection transistors GST may be programmed during an erasing operation.

Likewise, string selection transistors SST may be programmed at erasing. When the erase voltage Vers is supplied to the substrate 111, it may be transferred to the bit lines BL1 and BL2 via cell strings CS11, CS12, CS21, and CS22 and the drains 320. In an embodiment, before a voltage of channel films 114 of a cell string of a second row and a first column reaches a specific level, the erase voltage Vers may be transferred to the bit line BL2 via a cell string CS22 of a second row and a second column. At this time, a hot electron injection program condition may be satisfied. Electrons of the channel films 114 may be accelerated in a direction of the bit line BL2 due to an electric field generated from the bit line BL2. The accelerated electrons may be injected to information storage films 116 of string selection transistors SST of a cell string CS21 of a second row and a first column, due to the electric field generated from a string selection line SSL2. That is, the string selection transistors SST may be programmed during an erasing operation. To prevent the above-described problems, a nonvolatile memory device 100 according to an exemplary embodiment of the inventive concept may be configured to adjust a level of an erase voltage Vers.

Figure 10:
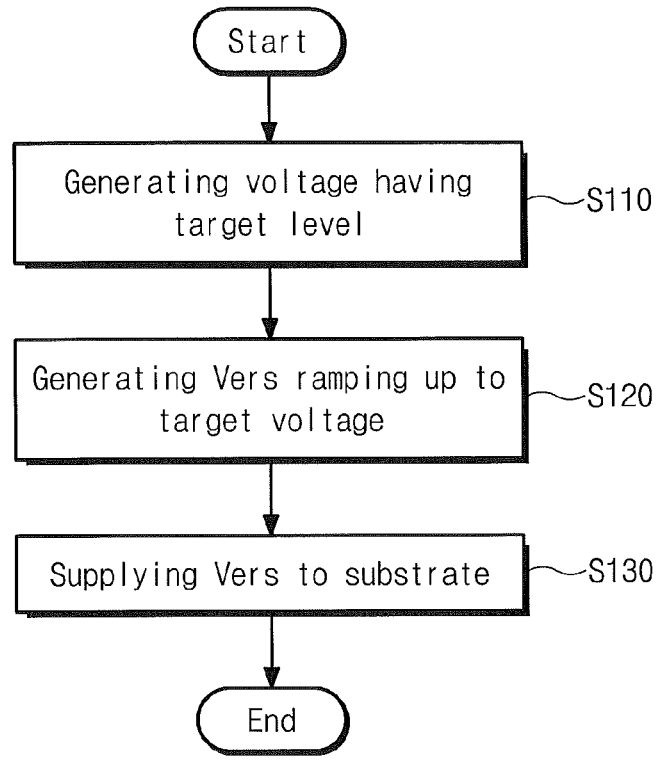
FIG. 10 is a flowchart illustrating an erase method according to an exemplary embodiment of the inventive concept.

FIG. 10 is a flowchart illustrating an erase method according to an exemplary embodiment of the inventive concept. Referring to FIG. 10, in operation S110, a target voltage Vtar having a target level may be generated. In an embodiment, the target level may be a voltage level required at erasing. In operation S120, an erase voltage Vers increased up to the target voltage may be generated. For example, the erase voltage Vers which gradually increases from a low level (e.g., a ground level) to the target level may be generated depending upon the target voltage generated in operation S110. In operation S130, the gradually increasing erase voltage Vers may be supplied to a substrate 111. The erase voltage Vers which gradually increases from a low level (e.g., a ground level) to the target level may be supplied to the substrate 111. Accordingly, a voltage of the substrate 111 may gradually increase from the low level (e.g., a ground level). A voltage of the substrate 111 may increase to be slower than that of the erase voltage Vers, due to resistance and capacitance of the substrate 111. Since a voltage of the substrate 111 gradually increases, there may be secured a delay when electrons existing at channel films 114 move into the substrate 111. Accordingly, string and ground selection transistors GST and SST may be prevented from being programmed during an erase operation.

Figure 11:
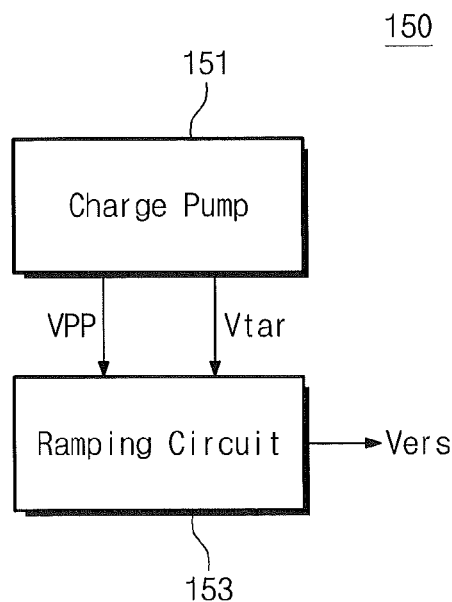
FIG. 11 is a block diagram illustrating an erase voltage generator in FIG. 1.

FIG. 11 is a block diagram illustrating an erase voltage generator in FIG. 1. Referring to FIG. 11, an erase voltage generator 150 may include a charge pump 151 and a ramping circuit 153. The charge pump 151 may be configured to generate a high voltage VPP and a target voltage Vtar. The target voltage Vtar may be a high voltage having a target level. The ramping circuit 153 may receive the high voltage VPP and the target voltage Vtar from the charge pump 151. The ramping circuit 153 may generate the erase voltage Vers gradually increasing up to the target level from the low level using the high voltage VPP and the target voltage Vtar.

Figure 12:
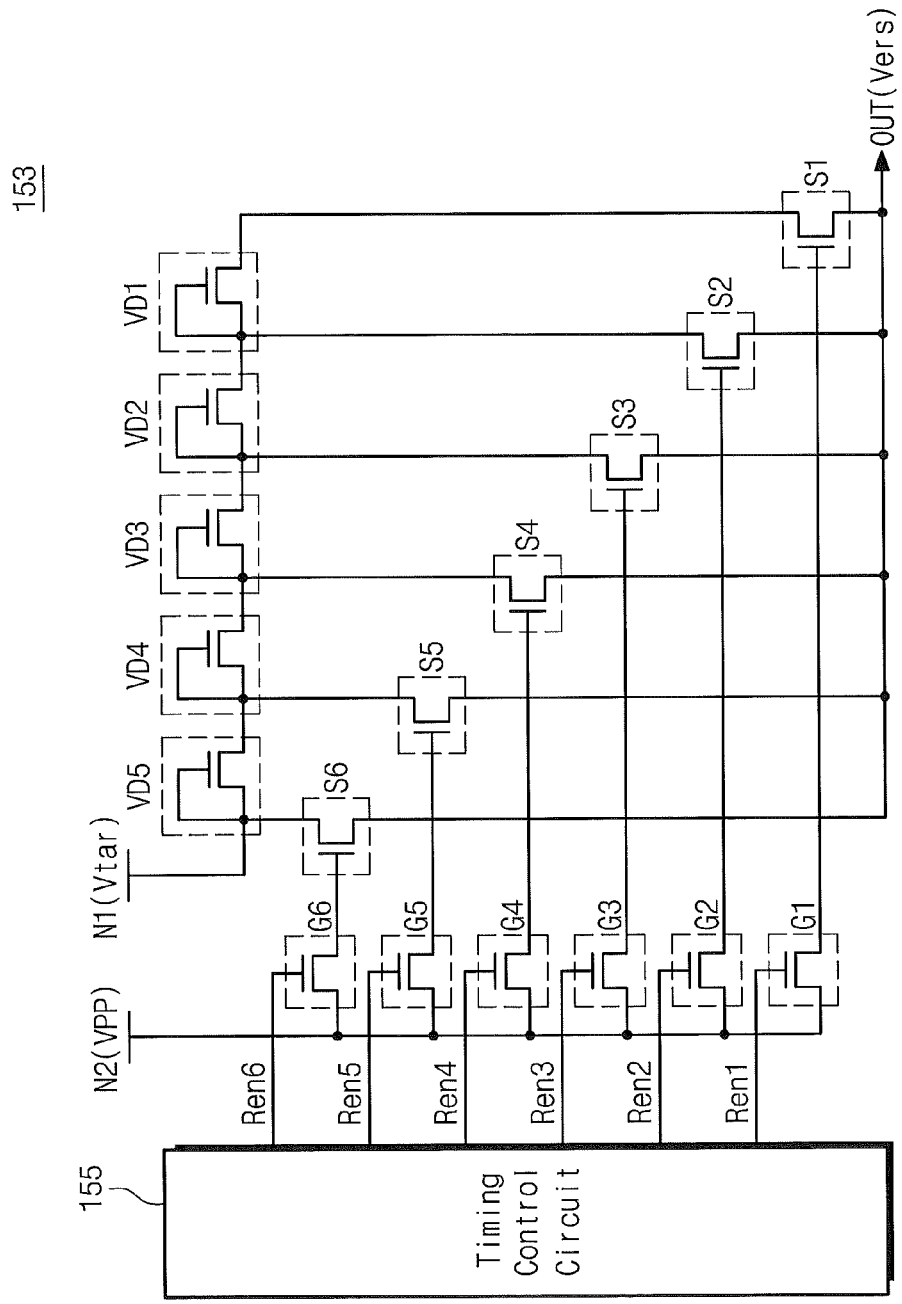
FIG. 12 is a circuit diagram illustrating a ramping circuit in FIG. 11.

FIG. 12 is a circuit diagram illustrating a ramping circuit in FIG. 11. Referring to FIG. 12, a plurality of voltage down elements VD1 to VD5, which may operate as diodes, may be connected in series to a first node N1 supplied with a target voltage Vtar. The longer a distance from the first node N1, the lower the voltages of the nodes between the voltage down elements VD1 to VD5. A node between fourth and fifth voltage drop elements VD4 and VD5 may have a voltage of Vtar minus a voltage dropped by the fifth voltage drop element. A node between third and fourth voltage drop elements VD3 and VD4 may have a voltage of Vtar minus a voltage dropped by the fourth and fifth voltage drop elements VD4 and VD5. A node between second and third voltage drop elements VD2 and VD3 may have a voltage of Vtar minus a voltage dropped by the third to fifth voltage drop elements VD3 to VD5. A node between first and second voltage drop elements VD1 and VD2 may have a voltage of Vtar minus a voltage dropped by the second to fifth voltage drop elements VD2 to VD5. A node of a right side of the first voltage drop element VD1 may have a voltage of Vtar minus a voltage dropped by the first to fifth voltage drop elements VD1 to VD5. In an embodiment, the voltage drop elements VD1 to DV5 may be formed of a diode-connected transistor. However, the inventive concept is not limited thereto. Further, the number of the voltage drop elements VD1 to DV5 is not limited thereto.

First to sixth switching elements S1 to S6 may be provided which are configured to selectively output voltages of the first node N1 supplied with the target voltage Vtar and the nodes between the voltage drop elements VD1 to VD5 to an output node OUT. The first switching element S1 may be connected between one end of the first voltage drop element VD1 and the output node OUT. The second switching element S2 may be connected between the node between the first and second voltage drop elements VD1 and VD2 and the output node OUT. The third switching element S3 may be connected between the node between the second and third voltage drop elements VD2 and VD3 and the output node OUT. The fourth switching element S4 may be connected between the node between the third and fourth voltage drop elements VD3 and VD4 and the output node OUT. The fifth switching element S5 may be connected between the node between the fourth and fifth voltage drop elements VD4 and VD5 and the output node OUT. The sixth switching element S6 may be connected between the first node N1 and the output node OUT.

A timing control circuit 155 and first to sixth gating elements G1 to G6 may be provided to control the first to sixth switching elements S1 to S6. Control nodes (e.g., gates) of the first to sixth gating elements G1 to G6 may be connected to a second node N2 supplied with a high voltage VPP. One ends of the first to sixth gating elements G1 to G6 may be connected to receive first to sixth ramping enable signals Ren1 to Ren6 generated from the timing control circuit 155. The other ends of the first to sixth gating elements G1 to G6 may be connected with the control nodes (e.g., gates) of the first to six switching elements S1 to S6.

The timing control circuit 155 may activate the first to sixth ramping enable signals Ren1 to Ren6 according to a specific timing. The first to sixth gating elements G1 to G6 may transfer the high voltage VPP supplied to the second node N2 into the first to sixth switching elements S1 to S6, in response to the first to sixth ramping enable signals Ren1 to Ren6, respectively. Referring to FIGS. 1 and 12, the timing control circuit 155 may control timing of the first to sixth ramping enable signals Ren1 to Ren6 under the control of control logic 150. The timing control circuit 155 may control timings of the first to sixth ramping enable signals Ren1 to Ren6 based upon previously stored information. Information controlling the timings of the first to sixth ramping enable signals Ren1 to Ren6 may be stored in an element that is capable of storing data by a user, such as a mode register set, a laser fuse, an electric fuse, nonvolatile memory cells, a metal option, or the like.

In the event a target level of the target voltage Vtar is a low voltage, one or more of the gating elements may be skipped. At this time, the first to sixth ramping enable signals Ren1 to Ren6 may be supplied directly to gates of the first to sixth switching elements S1 to S6. In an embodiment, the first to sixth switching elements 51 to S6 and the first to sixth gating elements G1 to G6 may be formed from transistors. However, the first to sixth switching elements S1 to S6 and the first to sixth gating elements G1 to G6 are not limited to transistors.

Figure 13:
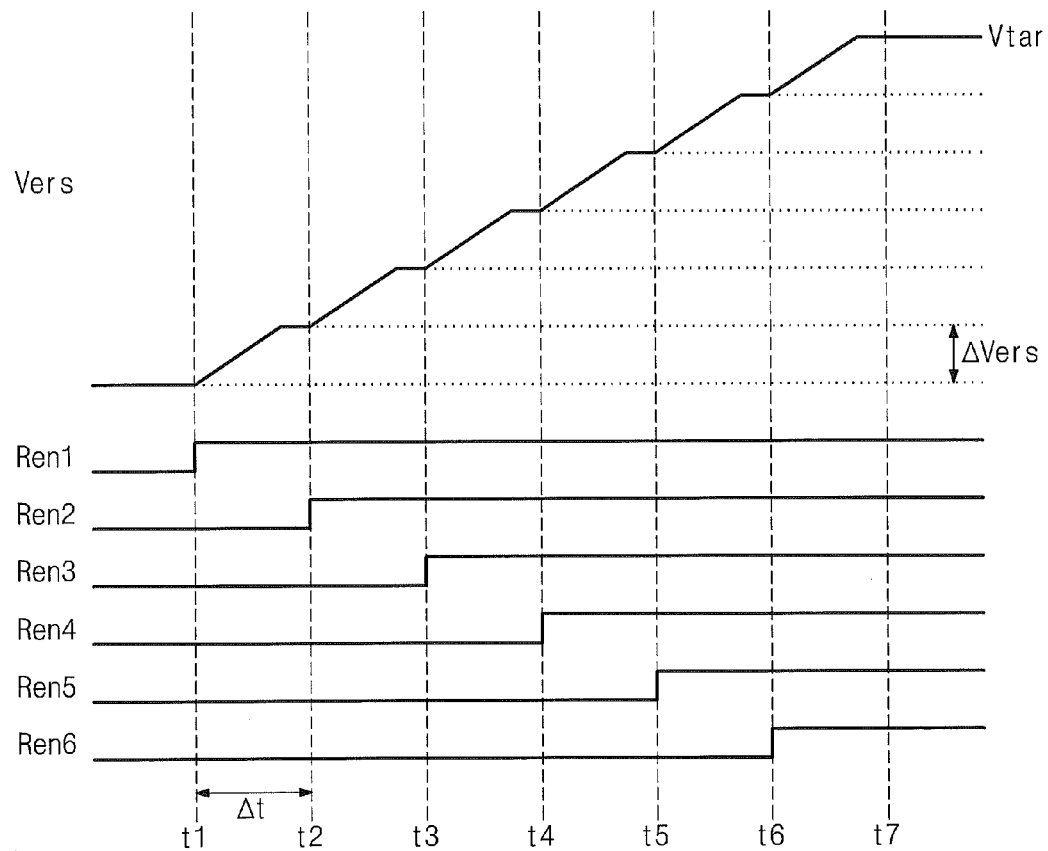
FIG. 13 is a graph illustrating an erase voltage output from a ramping circuit in FIG. 12 according to an exemplary embodiment of the inventive concept.

FIG. 13 is a graph illustrating an erase voltage output from a ramping circuit in FIG. 12 according to an exemplary embodiment of the inventive concept. Referring to FIGS. 12 and 13, at t1, a first ramping enable signal Ren1 may be activated. Accordingly, a voltage of one end of a first voltage drop element VD1 may be transferred to an output node OUT. A level of an erase voltage Vers may increase by a voltage difference ΔVers from a low level (e.g., a ground level). In an embodiment, a level of the erase voltage Vers may increase up to a voltage of a target level minus a voltage dropped by first to fifth voltage drop elements VD1 to VD5.

After a delay time Δt elapses, that is, at t2, a second ramping enable signal Ren2 may be activated. Accordingly, a voltage of a node between the first and second voltage drop elements VD1 and VD2 may be transferred to the output node OUT. A level of an erase voltage Vers may increase by the voltage difference ΔVers. A level of the erase voltage Vers may increase up to a voltage of the target level minus a voltage dropped by the second to fifth voltage drop elements VD2 to VD5.

After the delay time Δt elapses, that is, at t3, a third ramping enable signal Ren3 may be activated. Accordingly, a voltage of a node between the second and third voltage drop elements VD2 and VD3 may be transferred to the output node OUT. A level of an erase voltage Vers may increase by the voltage difference ΔVers. A level of the erase voltage Vers may increase up to a voltage of the target level minus a voltage dropped by the third to fifth voltage drop elements VD3 to VD5.

After an additional delay time Δt elapses, that is, at t4, a fourth ramping enable signal Ren4 may be activated. Accordingly, a voltage of a node between the third and fourth voltage drop elements VD3 and VD4 may be transferred to the output node OUT. A level of an erase voltage Vers may increase by the voltage difference ΔVers. A level of the erase voltage Vers may increase up to a voltage of the target level minus a voltage dropped by the fourth and fifth voltage drop elements VD4 and VD5.

After an additional delay time Δt elapses, that is, at t5, a fifth ramping enable signal Ren5 may be activated. Accordingly, a voltage of a node between the fourth and fifth voltage drop elements VD4 and VD5 may be transferred to the output node OUT. A level of an erase voltage Vers may increase by the voltage difference ΔVers. A level of the erase voltage Vers may increase up to a voltage of the target level minus a voltage dropped by the fifth voltage drop element VD5.

After the final delay time Δt elapses, that is, at t6, a sixth ramping enable signal Ren6 may be activated. Accordingly, a target voltage Vtar of a first node N1 may be transferred to the output node OUT. A level of an erase voltage Vers may increase by the voltage difference ΔVers. A level of the erase voltage Vers may increase up to a target level.

If one ramping enable signal is activated, a next ramping enable signal may be activated after a delay time Δt elapses. As the delay time Δt increases, a total increasing rate of the erase voltage Vers may decrease. As the delay time Δt decreases, a total increasing rate of the erase voltage Vers may increase. Accordingly, an increasing rate where the erase voltage Vers gradually increases may be controlling by adjusting a delay time Δt. In the illustrated embodiment, a ramping circuit 153 generating a six-step increasing erase voltage Vers is exemplarily described. However, a step number of the erase voltage Vers is not limited thereto.

Figure 14:
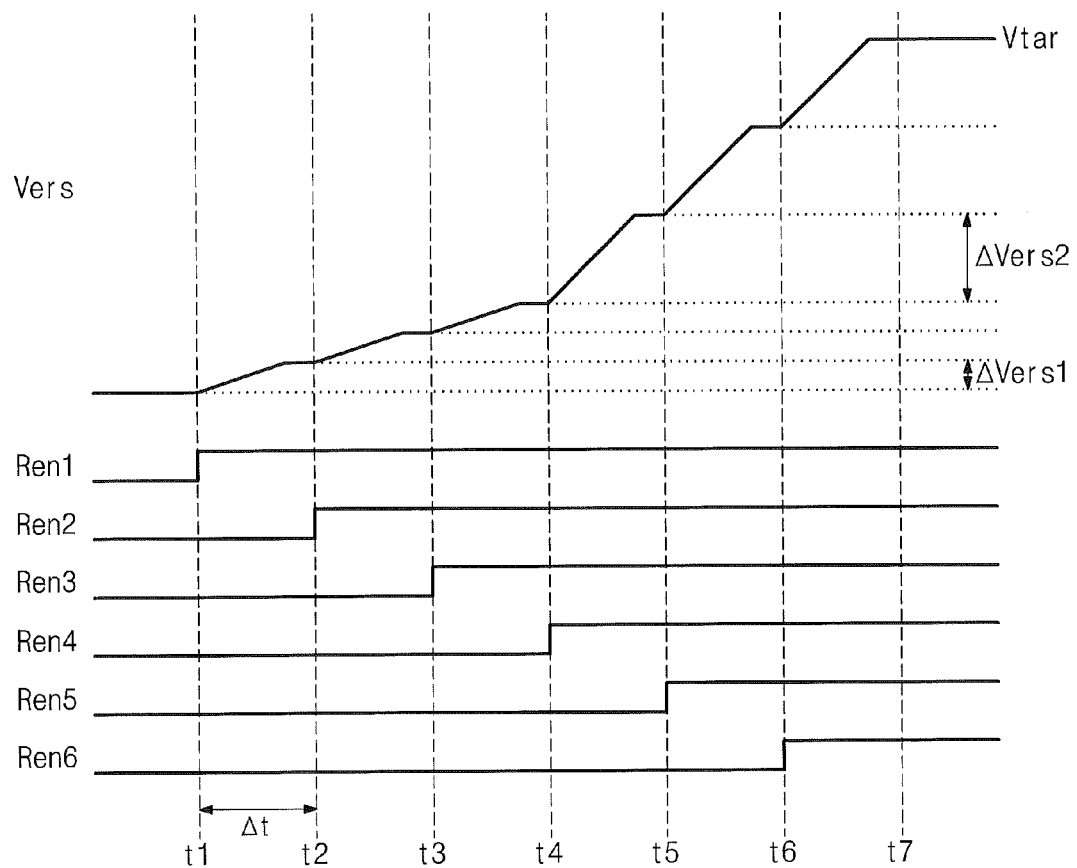
FIG. 14 is a graph illustrating an erase voltage output from a ramping circuit in FIG. 12 according to another exemplary embodiment of the inventive concept.

FIG. 14 is a graph illustrating an erase voltage output from a ramping circuit in FIG. 12 according to another exemplary embodiment of the inventive concept. Referring to FIGS. 12 and 14, enable timing of first to sixth ramping enable signals Ren1 to Ren6 may be identical to that described in relation to FIG. 13. When the first to third ramping enable signals Ren1 to Ren3 are activated, an erase voltage Vers may increase by a first voltage difference ΔVers1. When the fourth to sixth ramping enable signals Ren4 to Ren6 are activated, the erase voltage Vers may increase by a second voltage difference ΔVers2. The first voltage difference ΔVers1 may be smaller than the second voltage difference ΔVers2. That is, an increasing rate of the erase voltage Vers may gradually increase. In an embodiment, an increasing rate of the erase voltage Vers may increase after electrons are removed from channel films 114. Voltage increasing rates may be controlled differently in accordance with voltage down elements VD1 to VD5, switching elements S1 to S6, gating elements G1 to G6, and a timing control circuit 155.

For example, if voltage levels dropped by the voltage down elements VD1 to VD5 are set to be different from one another, voltage increasing rates may be controlled to be different from one another as illustrated in FIG. 14. If threshold voltages of the switching elements S1 to S6 are controlled differently, voltage increasing rates may be controlled to be different from one another as illustrated in FIG. 14. As a threshold voltage of a specific switching element increases, a voltage increasing rate corresponding to the specific switching element may decrease. In the event the threshold voltages of the gating elements G1 to G6 are controlled differently, voltage increasing rates may be controlled to be different from one another as illustrated in FIG. 14. As a threshold voltage of a specific gating element increases, a voltage applied to a gate of a switching element via the specific gating element may decrease. Accordingly, a threshold voltage of a specific gating element increases, a voltage increasing rate corresponding to the specific gating element may decrease. If levels of the first to sixth ramping enable signals Ren1 to Ren6 are controlled differently, voltage increasing rates may be controlled to be different from one another as illustrated in FIG. 14. As a threshold voltage of a specific ramping enable signal increases, an output voltage of a gating element corresponding to the specific ramping enable signal may decrease. Accordingly, a voltage level of a specific ramping enable signal increases, a voltage increasing rate corresponding to the specific ramping enable signal may decrease. In an embodiment, there is exemplarily described an example that an increasing rate of the erase voltage Vers is varied once. However, the inventive concept is not limited thereto.

Figure 15:
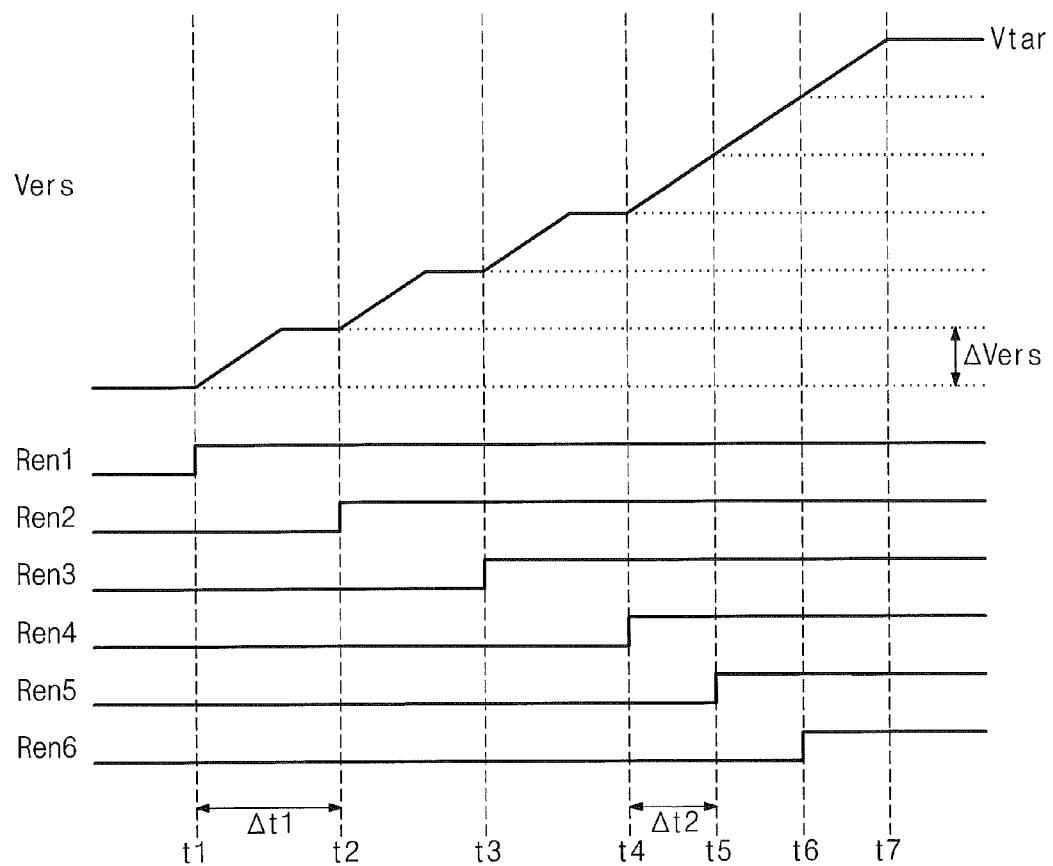
FIG. 15 is a graph illustrating an erase voltage output from a ramping circuit in FIG. 12 according to still another exemplary embodiment of the inventive concept.

FIG. 15 is a graph illustrating an erase voltage output from a ramping circuit in FIG. 12 according to still another exemplary embodiment of the inventive concept. Referring to FIGS. 12 and 15, a voltage difference Vers corresponding to first to sixth ramping enable signals Ren1 to Ren6 may be kept to be constant. After one of the first to third ramping enable signals Ren1 to Ren3 is activated and a first delay time Δt 1 elapses, a next ramping enable signal may be activated. After one of the fourth to sixth ramping enable signals Ren4 to Ren6 is activated and a second delay time Δt2 elapses, a next ramping enable signal may be activated. The second delay time Δt2 may be shorter than the first delay time Δt1. That is, an increasing rate of the erase voltage Vers may gradually increase. In an embodiment, an increasing rate of the erase voltage Vers may increase after electrons move from channel films 114.

An increasing rate of the erase voltage Vers may gradually increase as illustrated in FIG. 15 by controlling timings of the first to sixth ramping enable signals Ren1 to Ren6 via a timing control circuit 153. In an embodiment, there is exemplarily described an example that an increasing rate of the erase voltage Vers is varied once. However, the inventive concept is not limited thereto.

Figure 16:
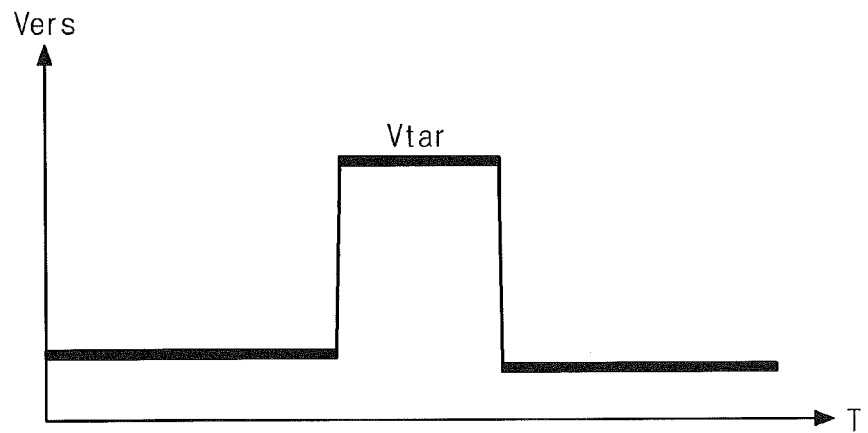
FIG. 16 is a graph illustrating a waveform of an erase voltage when the erase voltage is a square wave, according to the prior art.

FIG. 16 is a graph illustrating a prior art waveform of an erase voltage when the erase voltage is a square wave. In FIG. 16, a horizontal axis indicates a time, and a vertical axis indicates a level of an erase voltage Vers. A maximum level of the erase voltage Vers may be a level of a target voltage Vtar.

Figure 17:
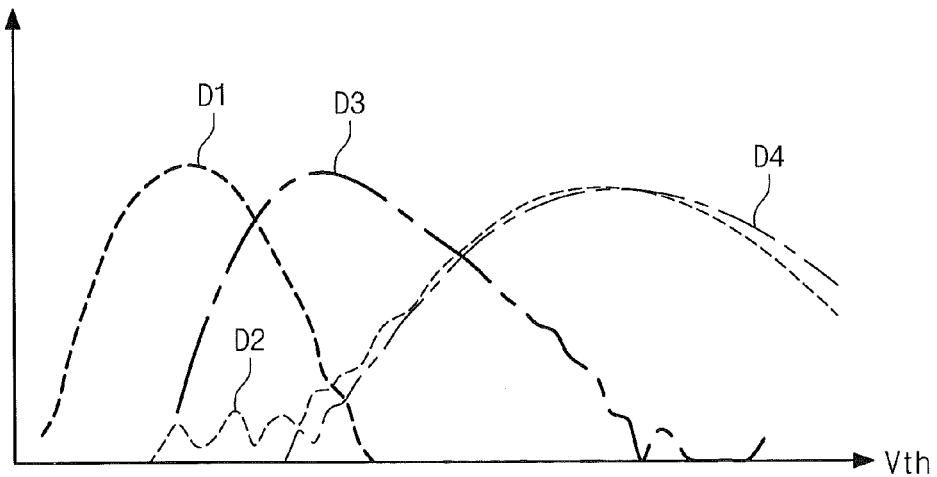
FIG. 17 is a diagram illustrating threshold voltages of string and ground selection transistors when performing an erase operation using the erase voltage of FIG. 16.

FIG. 17 is a diagram illustrating threshold voltages of string and ground selection transistors when performing an erase operation using an erase voltage in FIG. 16. In FIG. 17, a horizontal axis indicates a threshold voltage, and a vertical axis indicates the number of selection transistors. In an embodiment, threshold voltages of string and ground selection transistors SST and GST when an erase operation is executed 1000 times using an erase voltage Vers in FIG. 16 are illustrated in FIG. 17. A first distribution D1 may indicate a distribution of threshold voltages of ground selection transistors GST before a memory block BLKa is erased. A second distribution D2 may indicate a distribution of threshold voltages of the ground selection transistors GST after an erase operation is performed 1000 times. Threshold voltages of the ground selection transistors GST may increase after an erase operation is executed using an erase voltage Vers in FIG. 16. That is, the ground selection transistors GST may become at least partially programmed at erasing. A third distribution D3 may indicate a distribution of threshold voltages of string selection transistors SST before a memory block BLKa is erased. A fourth distribution D4 may indicate a distribution of threshold voltages of the string selection transistors SST after an erase operation is performed 1000 times. Threshold voltages of the string selection transistors SST may increase after an erase operation is executed using an erase voltage Vers in FIG. 16. That is, the string selection transistors SST may become at least partially programmed during erasing.

Figure 18:
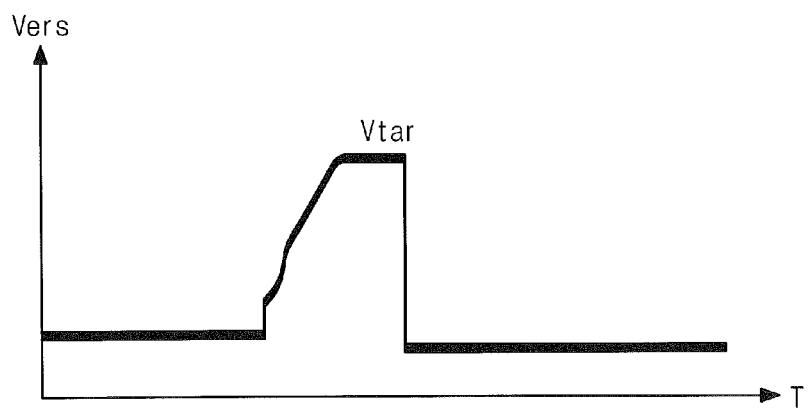
FIG. 18 is a graph illustrating a waveform of an erase voltage when the erase voltage gradually increases.

FIG. 18 is a graph illustrating a waveform of an erase voltage when the erase voltage gradually increases. In FIG. 18, a horizontal axis indicates a time, and a vertical axis indicates a level of an erase voltage Vers. A maximum level of the erase voltage Vers may be a level of a target voltage Vtar.

Figure 19:
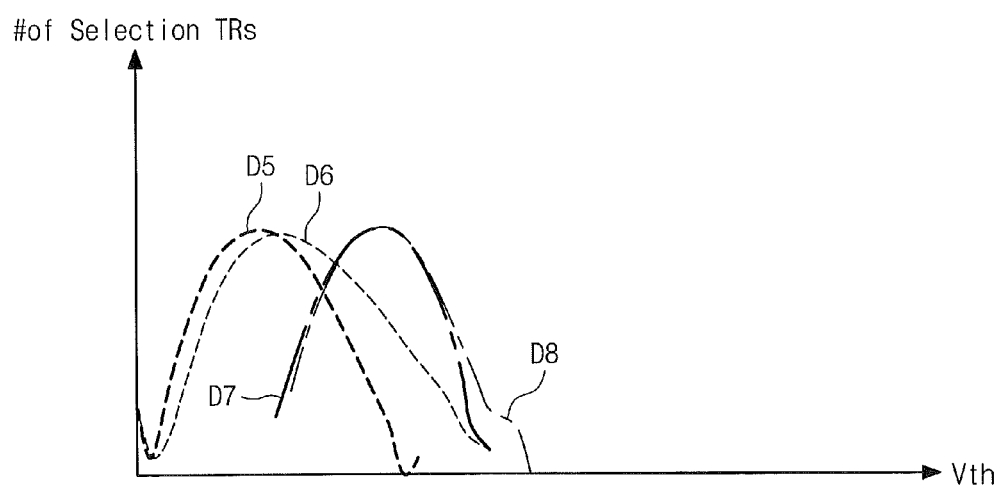
FIG. 19 is a diagram illustrating threshold voltages of string and ground selection transistors when performing an erase operation using an erase voltage in FIG. 18.

FIG. 19 is a diagram illustrating threshold voltages of string and ground selection transistors when performing an erase operation using an erase voltage in FIG. 18, according to embodiments of the invention. In FIG. 19, a horizontal axis indicates a threshold voltage, and a vertical axis indicates the number of selection transistors. In an embodiment, threshold voltages of string and ground selection transistors SST and GST when an erase operation is executed 1000 times using an erase voltage Vers in FIG. 18 are illustrated in FIG. 19. A fifth distribution D5 may indicate a distribution of threshold voltages of ground selection transistors GST before a memory block BLKa is erased. A sixth distribution D6 may indicate a distribution of threshold voltages of the ground selection transistors GST after an erase operation is performed 1000 times. Unlike FIG. 17, which shows that threshold voltages of the ground selection transistors GST increase, threshold voltages of the ground selection transistors GST may be maintained as described in FIG. 19.

A seventh distribution D7 may indicate a distribution of threshold voltages of string selection transistors SST before a memory block BLKa is erased. An eighth distribution D8 may indicate a distribution of threshold voltages of the string selection transistors SST after an erase operation is performed 1000 times. Unlike FIG. 17 showing that threshold voltages of the string selection transistors SST increase, threshold voltages of the string selection transistors SST may be maintained as described in FIG. 19. As described above, undesired programming of string and ground selection transistors at erasing may be prevented. Accordingly, it is possible to provide a nonvolatile memory device with the improved reliability and its erase method.

Figures 20, 21:
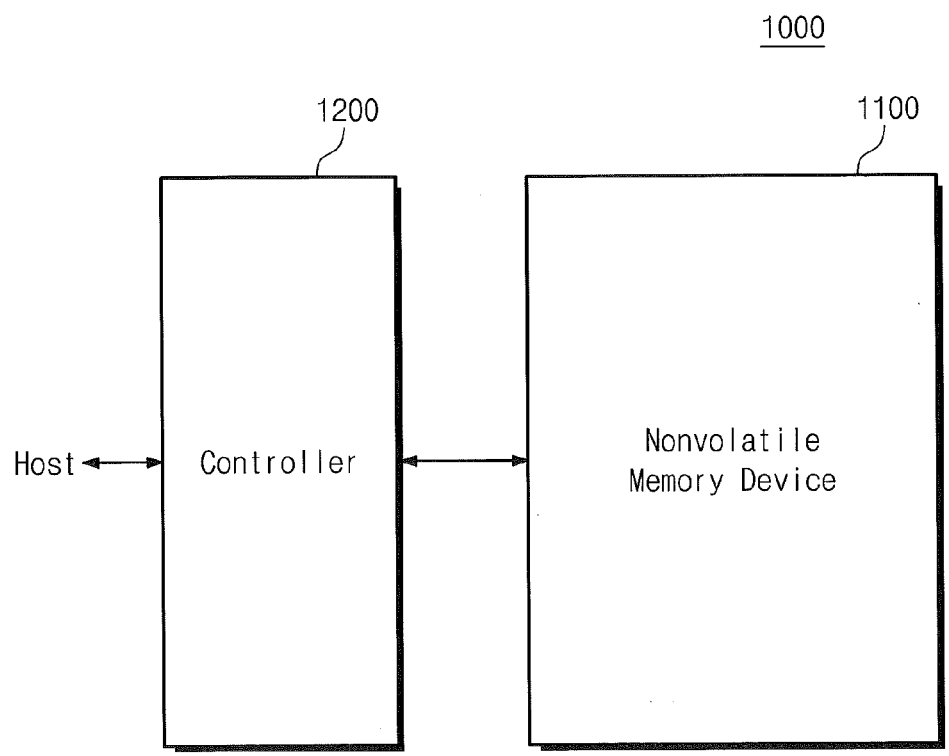
FIG. 20 is a table illustrating another embodiment of voltages applied to a memory block at erasing.
FIG. 21 is a block diagram illustrating a memory system according to an exemplary embodiment of the inventive concept.

FIG. 20 is a table illustrating another embodiment of voltages applied to a memory block at erasing. As compared with a table in FIG. 8, after a ground voltage VSS is supplied to a ground selection line GSL, the ground selection line GSL may be floated. Supplying of the ground voltage VSS to the ground selection line GSL may be made when an erase voltage Vers is supplied to a substrate 111 or when the erase voltage Vers is supplied to the substrate 111 at specific time points. If the ground voltage VSS is supplied to the ground selection line GSL, a quasi-on of ground selection transistors GST may be prevented. Accordingly, the erase voltage Vers may be supplied normally to channel films 114. Likewise, string selection lines SSL1 and SSL2 may be floated after the ground voltage VSS is supplied to the string selection lines SSL1 and SSL2.

FIG. 21 is a block diagram illustrating a memory system according to an exemplary embodiment of the inventive concept. Referring to FIG. 21, a memory system 1000 may include a nonvolatile memory device 1100 and a controller 1200. The nonvolatile memory device 1100 may be substantially identical to a nonvolatile memory device 100 according to an exemplary embodiment of the inventive concept. That is, the nonvolatile memory device 1100 may include a plurality of cell strings CS11, CS12, CS21, and CS22 provided on a substrate 111, each cell string including a plurality of cell transistors CT stacked in a direction orthogonal to the substrate 111. The nonvolatile memory device 1100 may be configured to generate a target voltage Vtar having a target level, to generate an erase voltage Vers stepwise increasing from a low level to a level of the target voltage Vtar, and to supply the erase voltage Vers to the substrate 111.

The controller 1200 may be coupled with a host and the nonvolatile memory device 1100. The controller 1200 may be configured to access the nonvolatile memory device 1100 in response to a request from the host. The controller 1200 may be configured to control read, program, erase, and background operations of the nonvolatile memory portion 1100, for example. The controller 1200 may be configured to provide an interface between the nonvolatile memory portion 1100 and the host. The controller 1200 may be configured to drive firmware for controlling the nonvolatile memory device 1100.

The controller 1200 may be configured to provide a control signal CTRL and an address ADDR to the nonvolatile memory device 1100. The nonvolatile memory device 1100 may be configured to perform read, erase, and write operations in response to the control signal CTRL and the address ADDR from the controller 1200. In an exemplary embodiment, the controller 1200 may further include constituent elements such as a RAM, a processing unit, a host interface, a memory interface, and the like. The RAM may be used as at least one of a working memory of the processing unit, a cache memory between the nonvolatile memory portion 1100 and the host, or a buffer memory between the nonvolatile memory portion 1100 and the host. The processing unit may control an overall operation of the controller 1200.

The host interface may include the protocol for executing data exchange between the host and the controller 1200. Exemplarily, the controller 1200 may communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and an IDE (Integrated Drive Electronics) protocol. The memory interface may interface with the nonvolatile memory device 1100. The memory interface may include a NAND interface or a NOR interface.

The memory system 1000 may further include an ECC block. The ECC block may be configured to detect and correct an error of data read from the nonvolatile memory device 1100 using ECC. The ECC block may be provided as an element of the controller 1200 or as an element of the nonvolatile memory device 1100. The controller 1200 and the nonvolatile memory device 1100 may be integrated in a single semiconductor device. The controller 1200 and the nonvolatile memory device 1100 may be integrated in a single semiconductor device to form a memory card. For example, the controller 1200 and the nonvolatile memory device 1100 may be integrated in a single semiconductor device to form a memory card such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, or the like.

The controller 1200 and the nonvolatile memory device 1100 may be integrated in a single semiconductor device to form a solid state drive (SSD). The SSD may include a storage device configured to store data in a semiconductor memory. If the memory system 1000 is used as the SSD, it is possible to remarkably improve an operating speed of a host coupled with the memory system 1000. In an exemplary embodiment, the memory system 10 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

In an exemplary embodiment, a nonvolatile memory device 1100 or a memory system 1000 may be packed by various types of packages such as PoP(Package on Package), Ball grid arrays(BGAs), Chip scale packages(CSPs), Plastic Leaded Chip Carrier(PLCC), Plastic Dual In-Line Package (PDI2P), Die in Waffle Pack, Die in Wafer Form, Chip On Board(COB), Ceramic Dual In-Line Package(CERDIP), Plastic Metric Quad Flat Pack(MQFP), Thin Quad Flatpack (TQFP), Small Outline(SOIC), Shrink Small Outline Package(SSOP), Thin Small Outline(TSOP), Thin Quad Flatpack (TQFP), System In Package(SIP), Multi Chip Package (MCP), Wafer-level Fabricated Package(WFP), Wafer-Level Processed Stack Package(WSP), and the like.

Figure 22:
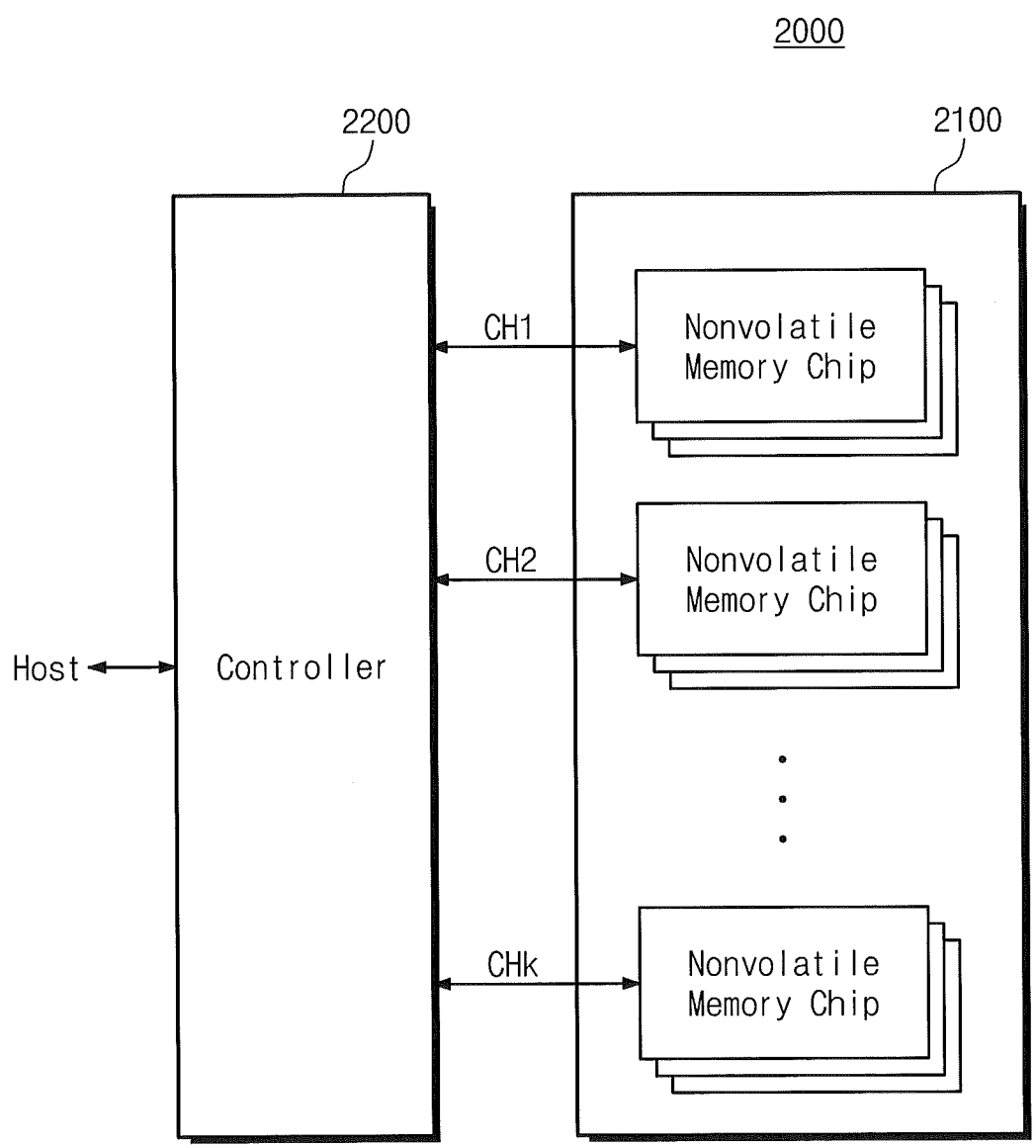
FIG. 22 is a block diagram illustrating an application of a memory system in FIG. 21.

FIG. 22 is a block diagram illustrating an application of a memory system in FIG. 21. Referring to FIG. 22, a memory system 2000 may include a nonvolatile memory device 2100 and a controller 2200. The nonvolatile memory device 2100 may include a plurality of nonvolatile memory chips, which are classified into a plurality of groups. Nonvolatile memory chips in each group may communicate with the controller 2200 via a common channel. In FIG. 22, there is exemplarily illustrated the case that a plurality of memory chips communicates with the controller 2200 via plural channels CH1 to CHk.

Each of the nonvolatile memory chips may be formed of a nonvolatile memory device 100 according to an exemplary embodiment of the inventive concept. That is, each nonvolatile memory chip may include a plurality of cell strings CS11, CS12, CS21, and CS22 provided on a substrate 111, each cell string including a plurality of cell transistors CT stacked in a direction perpendicular to the substrate 111. Each nonvolatile memory chip may be configured to generate a target voltage Vtar having a target level, to generate an erase voltage Vers stepwise increasing from a low level to a level of the target voltage Vtar, and to supply the erase voltage Vers to the substrate 111. As illustrated in FIG. 22, one channel may be connected with a plurality of nonvolatile memory chips.

However, the memory system 2000 may be modified such that one channel is connected with one nonvolatile memory chip.

Figure 23:
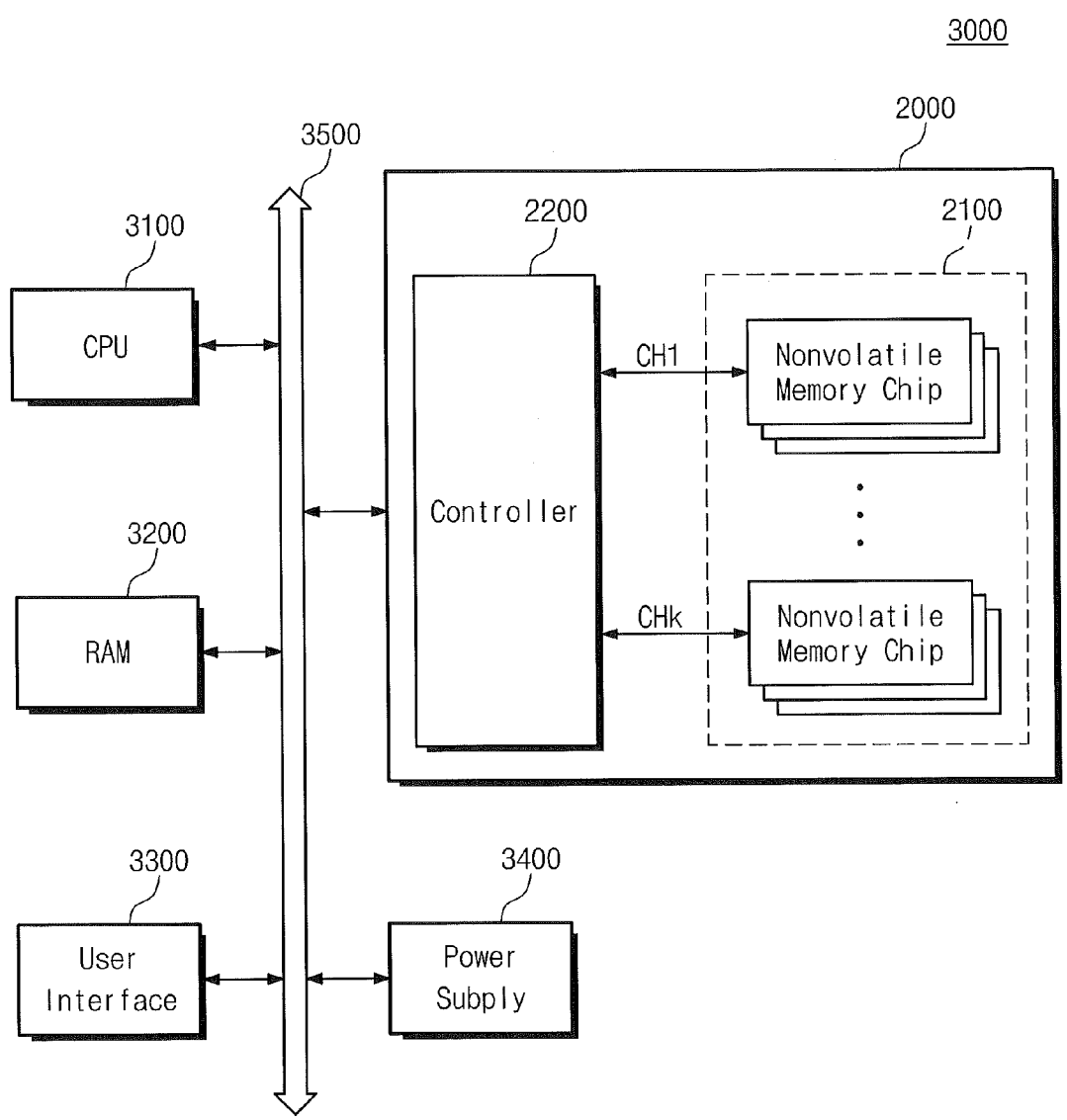
FIG. 23 is a block diagram illustrating a computing system including a memory system described in FIG. 22.

FIG. 23 is a block diagram illustrating a computing system including a memory system described in FIG. 22. Referring to FIG. 23, a computing system 3000 may include a CPU 3100, a RAM 3200, a user interface 3300, a power supply 3400, and a memory system 2000. The memory system 2000 may be electrically connected with the CPU 3100, the RAM 3200, the user interface 3300, and the power supply 3400. Data provided via the user interface 3300 or processed by the CPU 3100 may be stored in the memory system 2000. As illustrated in FIG. 23, a nonvolatile memory device 2100 may be connected with a system bus 3500 via a controller 2200. However, the nonvolatile memory device 2100 can be connected directly with the system bus 3500. The memory system 2000 in FIG. 23 may be a memory system described in FIG. 22. However, the memory system 2000 can be replaced with a memory system 1000 described with reference to FIG. 21. In an exemplary embodiment, the computing system may be configured to include all memory systems 1000 and 2000 described with reference to FIGS. 21 and 22.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit memory device, comprising:
 a plurality of vertically-stacked strings of nonvolatile memory cells having respective vertically-arranged channel regions therein electrically coupled to an underlying substrate; and
 a control circuit configured to drive the channel regions with a continuous erase voltage that is ramped from a first voltage level to a higher second voltage level during an erase time interval concurrently with electrically floating ground and string selection lines within said plurality of vertically-stacked strings of nonvolatile memory cells during at least a second portion of the erase time interval.

2. The memory device of claim 1, wherein said control circuit comprises an erase voltage generator configured to generate the continuous erase voltage as a monotonically increasing voltage during the erase time interval.

3. The memory device of claim 2, wherein the erase voltage generator is configured to generate the continuous erase voltage as a monotonically increasing voltage that is repeatedly stepped-up during multiple time intervals within the erase time interval.

4. The memory device of claim 2, wherein the erase voltage generator comprises a totem-pole arrangement of transistors configured as diodes.

5. The memory device of claim 4, wherein the erase voltage generator comprises a charge pump and a ramping circuit; and wherein the ramping circuit is configured to generate the continuous erase voltage by sequentially tapping intermediate nodes of the totem-pole arrangement of transistors having different voltage levels.

6. The memory device of claim 2, wherein the erase voltage generator comprises a charge pump and a ramping circuit; wherein the ramping circuit comprises a timing control circuit configured to generate a sequence of ramping enable signals during the erase time interval; and wherein the ramping enable signals comprise respective pulses with leading edges that are spaced-apart relative to each other at respective time points within the erase time interval.

7. An erase method of a nonvolatile memory device which includes a substrate and a plurality of cell strings provided on the substrate, each cell string including a plurality of cell transistors stacked in a direction perpendicular to the substrate, the erase method comprising:
 generating a target voltage having a target level;
 supplying a continuous erase voltage having a level gradually increasing up to the target level, based upon the target voltage; and
 supplying a word line erase voltage to a plurality of word lines connected with the plurality of cell transistors.

8. The erase method of claim 7, wherein supplying the continuous erase voltage comprises:
 supplying the continuous erase voltage with a voltage increasing rate increasing gradually.

9. The erase method of claim 7, further comprising:
 floating a plurality of string selection lines and a plurality of ground selection lines connected with the plurality of cell transistors.

10. The erase method of claim 7, further comprising:
 floating a plurality of string selection lines and a plurality of ground selection lines connected with the plurality of cell transistors after supplying a ground voltage to the plurality of string selection lines and the plurality of ground selection lines.

11. A nonvolatile memory device comprising:
 a memory cell array including a substrate and a plurality of cell strings provided on the substrate, each cell string including a plurality of cell transistors stacked in a direction perpendicular to the substrate;
 a decoder connected with the memory cell array via word lines, string selection lines, and ground selection lines;
 a read/write circuit connected with the memory cell array via bit lines; and
 an erase voltage generator circuit configured to supply the substrate with a continuous erase voltage at an erase operation, the continuous erase voltage increasing gradually.

12. The nonvolatile memory device of claim 11, wherein the erase voltage generator circuit comprises:
 a charge pump configured to generate a target voltage; and
 a ramp circuit configured to receive the target voltage from the charge pump and to generate the continuous erase gradually increasing up to a level of the target voltage from a low voltage.

13. The nonvolatile memory device of claim 12, wherein the ramp circuit comprises:
 a plurality of voltage down elements connected in series to a first node supplied with the target voltage;
 a plurality of switching elements having one nodes connected with the first node and nodes between the plurality of voltage down elements and another nodes connected with the output node; and
 a timing control circuit configured to control the plurality of switching elements sequentially.

14. The nonvolatile memory device of claim 13, wherein the timing control circuit is configured to turn on a switching element corresponding to a voltage down element uttermost from the first node firstly and a switching element corresponding to a voltage down element closer to the first node later.

15. The nonvolatile memory device of claim 13, wherein a voltage level dropped by a voltage down element uttermost from the first node is smaller than that of a voltage down element closer to the first node.

16. The nonvolatile memory device of claim 13, wherein a threshold voltage of a switching element corresponding to a voltage down element uttermost from the first node is larger than that corresponding to a voltage down element closer to the first node.

17. The nonvolatile memory device of claim 13, wherein the timing control circuit is configured to turn on voltage down elements far from the first node sequentially by a first time unit and voltage down elements closer to the first node sequentially by a second time unit shorter than the first time unit.

18. The nonvolatile memory device of claim 13, wherein the ramp circuit further comprises:
    gating elements configured to supply a high voltage to the plurality of switching elements according to a control of the timing control circuit.

19. The nonvolatile memory device of claim 12, wherein the ramp circuit is further configured to generate the continuous erase voltage which increases with a second voltage increasing rate larger than a first voltage increasing rate after the continuous erase voltage increases with the first voltage increasing rate.

20. The nonvolatile memory device of claim 11, wherein the memory cell array comprises:
    a plurality of structures including conductive materials and insulation materials stacked in a direction perpendicular to the substrate in turn;
    a plurality of pillars penetrating the structures in a direction perpendicular to the substrate to contact with the substrate; and
    a plurality of doping regions provided at the substrate between the plurality of structures,
    wherein the plurality of structures and the plurality of pillars constitute the plurality of cell strings and the plurality of doping regions form a common source line connected in common with the plurality of cell strings.

* * * * *